(12) United States Patent
Amemiya

(10) Patent No.: US 6,812,473 B1
(45) Date of Patent: Nov. 2, 2004

(54) ELECTRON BEAM DRAWING MASK BLANK, ELECTRON BEAM DRAWING MASK, AND METHOD OF MANUFACTURING THE SAME

(75) Inventor: Isao Amemiya, Yamanashi (JP)

(73) Assignee: Hoya Corporation, Tokyo (JP)

( * ) Notice: Subject to any disclaimer, the term of this patent is extended or adjusted under 35 U.S.C. 154(b) by 302 days.

(21) Appl. No.: 09/606,679

(22) Filed: Jun. 30, 2000

(30) Foreign Application Priority Data

Jun. 30, 1999 (JP) .......................................... 11-186954
May 26, 2000 (JP) ...................................... 2000-156726

(51) Int. Cl.[7] .............................................. G03F 9/00
(52) U.S. Cl. .............................. 250/492.22; 250/492.1
(58) Field of Search ...................... 250/492.1, 492.22, 250/400

(56) References Cited

U.S. PATENT DOCUMENTS

| | | | |
|---|---|---|---|
| 5,260,151 A | 11/1993 | Berger et al. ................... | 430/5 |
| 5,466,904 A | 11/1995 | Pfeiffer et al. ......... | 219/121.25 |
| 5,866,913 A | 2/1999 | Robinson | |
| 5,953,492 A * | 9/1999 | Yabe et al. .................. | 392/418 |
| 6,051,346 A * | 4/2000 | Kornblit et al. ............... | 430/5 |
| 6,428,937 B1 * | 8/2002 | Katakura ....................... | 430/5 |

FOREIGN PATENT DOCUMENTS

| | | |
|---|---|---|
| JP | 61 121056 A | 6/1986 |
| JP | 10-260523 | 9/1998 |
| JP | 10-261584 | 9/1998 |
| JP | 2857384 | 11/1998 |
| JP | 10-321495 | 12/1998 |

OTHER PUBLICATIONS

S.D. Berger et al, "New Approach to Projection–Electron Lithography with Demonstrated 0.1 $\mu$m Linewidth", Appl. Phys. Letter, 57(2), Jul. 9, 1990, pp. 153.

H. Bohlen, et al, "High Throughput Submicron Lithography with Electron Beam Proximity Printing", Solid State Technology, Sep. 1984, pp. 210.

* cited by examiner

*Primary Examiner*—John R. Lee
*Assistant Examiner*—Erin-Michael Gill
(74) *Attorney, Agent, or Firm*—Sughrue Mion, PLLC

(57) ABSTRACT

An electron beam drawing mask includes a pattern supporting film for transmitting an electron beam therethrough; an electron beam scattering body pattern formed over the pattern supporting film; and a support member for supporting the pattern supporting film and the electron beam scattering body pattern. The pattern supporting film has a film thickness of 0.005 to 0.2 micron, a film material density of 1.0 to 5.0 g/cm$^3$ and an elastic modulus of 0.8×10$^{11}$ Pa or higher. The electron beam scattering body pattern has a film thickness of 0.2 to 2 micron, a film material density of 1.0 to 5.0 g/cm$^3$, and an elastic modulus of 0.8×10$^{11}$ Pa or higher.

81 Claims, 11 Drawing Sheets

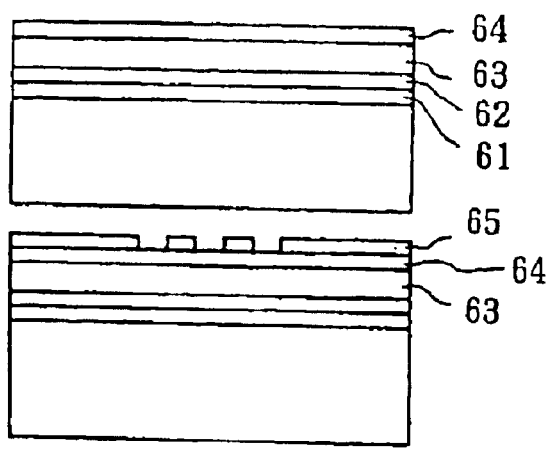
FIG.16A
FIG.16B
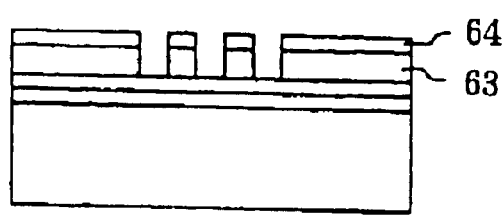
FIG.16C
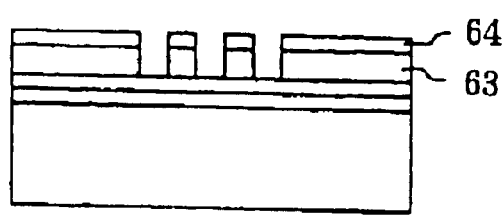
FIG.16D
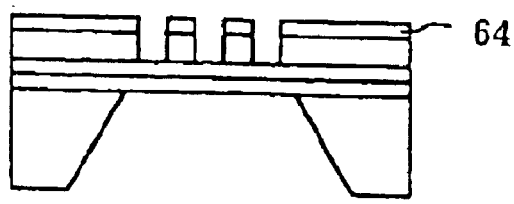
FIG.16E
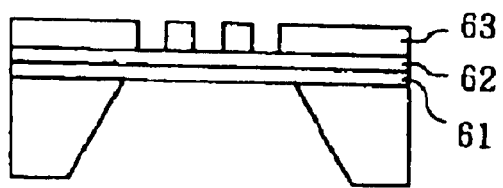

ELECTRON BEAM DRAWING MASK BLANK, ELECTRON BEAM DRAWING MASK, AND METHOD OF MANUFACTURING THE SAME

BACKGROUND OF THE INVENTION

The present invention relates to a transfer mask (or a reticle) to be used in a lithography technique for manufacturing a semiconductor device or the like by using a charged particle beam or an electron beam, a mask blank (or a mask forming substrate), and a method for manufacturing the mask.

In order to form a wiring pattern or the like, there has been utilized the lithography technique. As the wiring pattern becomes the finer, the optical lithography technique or a general technique has found it the more difficult to form the pattern. For this difficulty, there has been investigated an exposure technique which uses a charged particle beam such as an electron beam or an ion beam or a short-wavelength beam such as an X-ray for the finer structure.

Of these, the electron beam drawing technique has transferred from the point beam drawing method at the initial stage to the variable shape drawing method for drawing by changing the size and shape of a square beam. After this, from the standpoint of improving the pattern precision and shortening the drawing time period, there has been proposed a partial batch drawing method by which a portion of a pattern is partially drawn in a batch through a mask such that the drawing is repeated. Subsequent to this partial batch drawing method, moreover, a new electron projection system (or the SCALPEL system) was proposed about eight years ago by S. D. Berger and others. After this, there have been made various proposals such as a similar drawing system (or the PREVAIL system) or a transfer mask (or reticle) structure to be applied to those drawing system, and their manufacturing methods. For example, U.S. Pat. No. 5,466,904 relates to the PREVAIL system, as invented by H. C. Pfeiffer and others. This PREVAIL system will be briefly explained. First of all, there is prepared a stencil mask in which a through-hole (or aperture) pattern is formed at each small region in predetermined size and arrangement. The small regions of the stencil mask are irradiated with the charged particle beam to shape the beam according to the through-hole pattern. An exposure substrate having a photosensitive material is irradiated with the shaped beam through an optical system so that the through-hole pattern is transferred in a reduced scale to the exposure substrate. Moreover, the device pattern is formed by jointing the predetermined pattern, as formed separately on the stencil mask, over the exposure substrate.

The transfer mask, as proposed for the PREVAIL system of this kind, has such a stencil type mask for its main structure that the pattern portion is composed of non-shielded through holes. This transfer mask is disclosed in Unexamined Published Japanese Patent Applications Nos. 10-261584 and 10-260523, for example. In the stencil type mask, the deflection of the pattern region is reduced by separating and reinforcing it from the back side with a strut (or bridge) structure. By this, it is intended to improve the pattern positioning precision.

As the mask for the SCALPEL system, on the other hand, there has been mainly proposed a scattering mask (or reticle) than the stencil mask. This scattering mask is disclosed, for example, in a publication (pp. 153, of APPL, PHYS. LETTERS 57(2) (1990), EDITED BY S. D. BERGER & J. M. GIBSON) or Unexamined Published Japanese Patent Applications Nos. 10-261584 and 10-321495. In the mask structure, according to these publications, there is formed over a membrane (or a self-sustaining thin film) of SiN or the like a heavy metal layer, over which a desired pattern is formed. Both these layers are irradiated with the electron beam, but the electron scattering degree is different depending upon whether the electron beam scattering body is present or not. By making use of this difference in the electron scattering degree, a beam contrast on the wafer is obtained to transfer the pattern in a reduced scale.

In the aforementioned exposure system, the high resolution featuring the charged particle ray can be satisfied to form a finer pattern than 0.1 micron. This exposure system is enabled to Improve the throughput in the manufacture of the device by enlarging the shot size drastically, as compared with the partial batch drawing method. When the maximum shot size over the exposure substrate is enlarged from 5 micron to 250 micron, for example, a throughput of 30 sheets/hour or more can be obtained with the minimum line width of 0.08 micron and for an eight-inch substrate. This exposure system has a highly practical system having an ability to produce a general-purpose device.

Thus, there have been made the various proposals including the proposal of the aforementioned new exposure system, the proposal relating to the transfer mask (or reticle) to be applied to that system, and proposal relating to a method for manufacturing the mask. However, the various mask structures thus proposed have several problems from the standpoint of practice. These problems will be cursorily reviewed in the following.

The types of the masks proposed heretofore are coarsely divided into two kinds. The first type is the stencil mask having a pattern of through holes. The second type is the scattering mask in which an electron beam scattering body made of a heavy metal is formed over a thin film transmission layer having a thickness of 100 to 200 nm. In addition, there is a proposal of the mask of the reflection type, the description of which will be omitted. The representative structures of the first and second types are shown in FIGS. 1 and 4, respectively.

As shown in FIG. 1, the transfer pattern portion of the stencil mask has through holes 1. It follows that there is little energy loss of the drawing electrons. Because of the pattern of a high aspect ratio, on the other hand, there is a problem in the pattern sizing precision. Because of the through holes, there is a problem on the mechanical strength of the mask. For these solutions, there is known the technique for improving the working precision and enhancing the mask strength by making the pattern region (or the thin film portion) as thin as possible (e.g., to 2 micron) and by forming struts (or a bridge) (although not shown) on the mask back side for supporting the pattern region (or the pattern field).

Where the transfer pattern has the through holes, however, the ring-shaped (or donut-shaped) pattern or the like cannot be formed in a completely independent form. A solution for this case is disclosed on pp. 210 of Solid State Technology, September (1984), edited by H. Bohlen and others. According to this method, there is prepared a complementary mask for assembling desired structural component patterns so that the pattern is formed by overlaying the complementary patterns. According to this method, however, at least two times as many as masks are required, and the shot number of exposures are increased to invite a drastic elongation of the exposure time period. This lowers the processing ability owned by the exposure system. Another demerit is that a proper pattern division is required for each device pattern. Moreover, a new problem occurs if the pattern region (or the thin film portion) is thinned to improve the working precision (or the pattern sizing precision).

The transfer pattern portion of the stencil mask has through holes. The pattern to be formed at this time raises no special problem if it is only contact holes (FIG. 2A) or a short line pattern (FIG. 2B), as shown in FIGS. 2A and 2B (in which the black portions indicate the through holes). For conveniences of the element pattern design, however, a pattern supporting portion 4 may be a cantilever pattern (as will be called the "leaf pattern"), as shown in FIGS. 3A and 3B (in which the black portions individually indicate the through holes 1).

in this case, the leaf pattern causes a deflection displacement in the longitudinal direction (i.e., in the normal to the mask face) in dependence upon the conditions. In the fine pattern or the line pattern (having an L & S ratio of 1:1) having a high pattern density; on the other hand, the mechanical strength is lowered in the transverse direction (i.e., in parallel with the mask face). If the material for the aperture body has an extremely large Young's modulus in this case, it is possible to reduce the deflection displacement. Even if a polycrystalline diamond film having the largest elastic coefficient known at present is applied to the aperture body, however, it is difficult to reduce the deflection displacement to a practical level so long as the sectional area of the pattern supporting portion 4 shrinks.

In the exposure system according to the SCALPEL system or the PREVAIL system, moreover, the mask always acts at a high speed so that a seriously high power in the transverse direction acts upon the aperture pattern (including the leaf pattern), as judged from the microscopic viewpoint in other words, it is important to view the mask rigidity not only in the longitudinal direction but also in the transverse direction (i.e., in parallel with the mask face). On the leaf pattern portion, however, there is caused to act the bending stress or the twisting stress by the high-speed movement of the mask stage so that a stress concentration occurs at the pattern supporting portion 4 of the leaf pattern. It is, therefore, predicted that the pattern breakage occurs.

In the SCALPEL mask (or the electron beam scattering mask), on the other hand, problems of the loss of the transmission electrons and the mask durability are caused by the electron beam scattering at the electron beam transmitting layer (or film) (as will be called the "pattern supporting layer (or film)" or the "membrane") by the mask structure.

With reference to FIG. 4, here will be described a sectional structure of the electron beam scattering mask. This electron beam scattering mask retains the contrast by the difference in the electron scattering degree depending upon the presence or absence of an electron beam scattering body 5 and by a limiting aperture. Since the self-sustainment is difficult with only the electron beam scattering body made of a heavy metal, however, a pattern supporting layer 6 has to be formed with a view to supporting the heavy metal scattering layer.

In the mask of this structure, there arise contrary problems of the thickness and the electron transmissivity of the pattern supporting layer 6 for supporting the electron beam scattering layer. As the material for the pattern supporting layer, there is known an SiN group or an Si material, and there is proposed a diamond film or the like. The preferable characteristics required for these pattern supporting layer materials are a low material density and an excellent material strength such as the Young's modulus. In other words, it can be said that the more excellent electron transmissivity at the pattern supporting layer 6 and the higher elastic modulus of the material are the preferable. From only the viewpoint of the electron transmissivity, the problems can be solved by making the acceleration voltage of the charge particle beam higher and the pattern supporting layer 6 thinner. The acceleration voltage of the electron source to be used in the SCALPEL or the like is as high as 100 KeV. Therefore, the thickness (of 50 to 200 nm) of the pattern supporting layer, as disclosed in U.S. Pat. No. 5,260,151, for example, transmits about 100% of electrons. In any substance, however, the electrons are scattered. The scattered electrons transmit through the pattern supporting layer. Since the electron outgoing angle from the pattern supporting layer is within a predetermined range, however, the electrons having an outgoing angle outside the predetermined range cannot pass through the limiting aperture which is formed in the upper portion of the exposure substrate in the exposure apparatus. This invites a reduction in the ratio of the electrons for the exposure (as will be called the "exposure electrons"). In order to reduce the electron number outside the predetermined range, i.e., to increase the electron number to transmit without being scattered, there is no way other than thinning the pattern supporting layer acting as the support.

In the case of the heavy metal scattering body, as exemplified by tungsten, however, a film thickness of about 50 nm is sufficient for retaining several times of electron scatterings. In order to support the scattering body having the thickness of 50 nm, however, an SiN film having a thickness of about 100 to 150 nm is necessary, if set from the viewpoint of the material strength characteristics by applying a pattern supporting layer of the silicon nitride (or the SiN group). If the pattern supporting layer having this film thickness is employed, the exposure electrons at the acceleration voltage of 100 KeV are reduced by about 40 to 50% by the electron scattering in the pattern supporting layer. If the SiN pattern supporting layer is thinned, it is deflected by the own weight of the tungsten scattering body. Moreover, the pattern supporting layer cannot stand many working steps so that it is liable to be broken.

It the electron beam scattering layer of the heavy metal is excessively thin, as described above, a satisfactory beam contrast cannot be obtained. If the electron beam scattering layer of the heavy metal is thickened to establish the satisfactory beam contrast, on the other hand, it is deflected by its own weight, or the film stress change (or the deflection change) is enlarged in the working step so that the breakage is liable to occur. In order to support the heavy metal electron beam scattering layer, on the other hand, the electron beam transmitting layer has to be made considerably thick to raise a problem that the exposure electrons are largely lost. In the SCALPEL mask, moreover, the demands for thinning the individual layers and for retaining the stress are contrary to each other so that the prior art has found it difficult to provide a practical mask.

Where the mask stage is operated at a high speed as in the stencil mask when the mask is employed, moreover, it is predicted that the pattern region (or the thin film portion) including the electron beam scattering body is extremely breakable.

In addition, where the scattering mask made of a electron beam scattering body of a heavy metal is to be applied to the exposure apparatus of the stepper type like the PREVAIL system, not only the reduction in the exposure electrons but also the aberration raises a problem. By the inelastic scattering at the pattern supporting layer, more specifically, the color aberration is caused due to the dispersion of the beam energy to invite a deterioration in the resolution. A countermeasure against this resolution deterioration is not practical in conclusion because the beam current value has to be extremely lowered to invite a drastic elongation of the exposure time period.

SUMMARY OF THE PRESENT INVENTION

Therefore, an object of the present invention is to provide an electron beam drawing mask capable of solving the problems such as the beam contrast, the control of the scattering angle of electrons, the loss of the exposure electrons, the reduction in the color aberration or the shortening of the exposure time period.

Another object of the present invention is to provide an electron beam drawing mask capable of improving the lithography characteristics and manufacturing a superhigh integrated circuit.

Still another object of the present invention is to provide a mask blank for the aforementioned electron beam drawing mask.

A further object of the present invention is to provide a method for manufacturing the aforementioned electron beam drawing mask.

In order to achieve the aforementioned objects, the present invention takes the following aspects.

(First Aspect)

According to a first aspect of the present invention, there is provided an electron beam drawing mask blank comprising: a pattern supporting layer for transmitting an electron beam therethrough; an electron beam scattering layer formed over the pattern supporting layer; and a support member for supporting the pattern supporting layer and the electron beam scattering layer. The electron beam drawing mask blank is characterized in that the electron beam scattering layer is made of a material composed substantially of the carbon element and/or the silicon element.

(Second Aspect)

According to a second aspect of the present invention, the electron beam drawing mask blank in the first aspect is characterized in that the electron beam scattering layer is made of a material composed substantially of the carbon element.

(Third Aspect)

According to a third aspect of the present invention, the electron beam drawing mask blank in the second aspect is characterized in that the electron beam scattering layer is made of either a DLC or a material containing a DLC doped with at least one of B, N, Si and P.

(Fourth Aspect)

According to a fourth aspect of the present invention, the electron beam drawing mask blank in the third aspect is characterized in that the doping of the DLC with at least one of B, N, Si and P is 0.1 to 40 mole %

(Fifth Aspect)

According to a fifth aspect of the present invention, the electron beam drawing mask blank in the first aspect is characterized in that the electron beam scattering layer is made of a material composed substantially of the silicon element.

(Sixth Aspect)

According to a sixth aspect of the present invention, the electron beam drawing mask blank in any of the first to fifth aspects is characterized in that the pattern supporting layer is made of a material composed substantially of the carbon element.

(Seventh Aspect)

According to a seventh aspect of the present invention, the electron beam drawing mask blank in the sixth aspect is characterized in that the pattern supporting layer is made of either a DLC or a material containing a DLC doped with at least one of B, N, P, Ti, Si and Al.

(Eighth Aspect)

According to an eighth aspect of the present invention, the electron beam drawing mask blank in the seventh aspect is characterized in that the doping of the DLC with at least one of B, N, P, Ti, Si and Al is 0.1 to 40 mole %.

(Ninth Aspect)

According to a ninth aspect of the present invention, the electron beam drawing mask blank in any of the first to fifth aspects is characterized in that the pattern supporting layer is made of a material composed substantially of the silicon element.

(Tenth Aspect)

According to a tenth aspect of the present invention, the electron beam drawing mask blank in any of the first to ninth aspects further comprises an etching stopper layer sandwiched either between the electron beam scattering layer and the pattern supporting layer or between the pattern supporting layer and the support member.

(Eleventh Aspect)

According to an eleventh aspect of the present invention, the electron beam drawing mask blank in the tenth aspect is characterized in that the etching stopper layer is made of a material having a high etching selection ratio with the electron beam scattering layer and/or the support member.

(Twelfth Aspect)

According to a twelfth aspect of the present invention, the electron beam drawing mask blank in any of the first to eleventh aspects is characterized in that the support member is made of a material composed substantially of the carbon element.

(Thirteenth Aspect)

According to a thirteenth aspect of the present invention, there is provided an electron beam drawing mask blank comprising: a pattern supporting layer for transmitting an electron beam therethrough; an etching stopper layer formed over the pattern supporting layer; an electron beam scattering layer formed over the etching stopper layer; and a support member for supporting the pattern supporting layer, the etching stopper layer and the electron beam scattering layer. The electron beam drawing mask blank is characterized: in that the electron beam scattering layer is made of either a DLC or a material containing a DLC doped with at least one of B, N, Si and P; in that the pattern supporting layer is made of either a DLC or a material containing a DLC doped with at least one of B, N, P, Ti, Si and Al; and in that the etching stopper layer is made of a material having a high etching selection ratio with the electron beam scattering layer.

(Fourteenth Aspect)

According to a fourteenth aspect of the present invention, there is provided an electron beam drawing mask blank comprising: a pattern supporting layer (or an electron beam transmitting layer) for transmitting an electron beam therethrough; an electron beam scattering layer formed over the pattern supporting layer; and a support member for supporting the pattern supporting layer and the electron beam scattering layer. The electron beam drawing mask blank is characterized in that the pattern supporting layer has a film thickness of 0.005 to 0.2 micron whereas the electron beam scattering layer has a film thickness of 0.2 to 2 micron so that they are made of materials satisfying these film thickness relations.

(Fifteenth Aspect)

According to a fifteenth aspect of the present invention, the electron beam drawing mask blank in the fourteenth aspect is characterized in that the pattern supporting layer satisfies the following Formula (1):

$$Tt \leq 2\alpha \qquad (1),$$

where Tt indicates the film thickness of the pattern supporting layer; and α indicates a mean free path of electrons in the pattern supporting layer.

(Sixteenth Aspect)

According to a sixteenth aspect of the present invention, the electron beam drawing mask blank in the sixteenth or fifteenth aspect is characterized in that the electron beam scattering layer satisfies the following Formula (2):

$$2\beta \leq Ts \leq 10\beta \qquad (2),$$

wherein: Ts indicates the film thickness of the electron beam scattering layer; and β indicates a mean free path of electrons in the electron beam scattering layer.

(Seventeenth Aspect)

According to a seventeenth aspect of the present invention, the electron beam drawing mask blank in any of the fourteenth to sixteenth aspects is characterized in that the pattern supporting layer and the electron beam scattering layer have film material densities of 1.0 to 5.0 g/cm$^3$.

(Eighteenth Aspect)

According to an eighteenth aspect of the present invention, the electron beam drawing mask blank in any of the fourteenth to seventeenth aspects is characterized in that the pattern supporting layer and/or the electron beam an scattering layer have elastic moduli of $0.8 \times 10^{11}$ Pa or higher.

(Nineteenth Aspect)

According to a nineteenth aspect of the present invention, the electron beam drawing mask blank in any of the fourteenth to eighteenth aspects is characterized in that the pattern supporting layer and/or the electron beam scattering layer have a film thickness dispersion of 30% or less within one shot area.

(Twentieth Aspect)

According to a twentieth aspect of the present invention, the electron beam drawing mask blank in any of the fourteenth to nineteenth aspects is characterized in that the electron beam scattering layer is made of a material composed substantially of the carbon element and/or the silicon element.

(Twenty-first Aspect)

According to a twenty-first aspect of the present invention, the electron beam drawing mask blank in any of the fourteenth to twentieth aspects further comprises an etching stopper layer sandwiched either between the electron beam scattering layer and the pattern supporting layer or between the pattern supporting layer and the support member.

(Twent-second Aspect)

According to a twenty-second aspect of the present invention, the electron beam drawing mask blank in the twenty first aspect is characterized in that the etching stopper layer has a film thickness of 0.005 to 0.2 micron.

(Twenty-third Aspect)

According to a twenty-third aspect of the present invention, the electron beam drawing mask blank in the twenty first or twenty second aspects is characterized in that the etching stopper layer has a film material density of 1.0 to 5.0 g/cm$^3$.

(Twenty-fourth Aspect)

According to a twenty-fourth aspect of the present invention, the electron beam drawing mask blank in any of the twenty first to twenty third aspects is characterized in that the etching stopper layer is made of a material having a high etching selection ratio with the electron beam scattering layer and/or the support member.

(Twenty-fifth Aspect)

According to a twenty-fifth aspect of the present invention, the electron beam drawing mask blank in any of the fourteenth to twenty fourth aspects is characterized in that at least one layer of the pattern supporting layer, the etching stopper layer and the electron beam scattering layer has a surface roughness (Ra) of 10 nm or lower.

(Twenty-sixth Aspect)

According to a twenty-sixth aspect of the present invention, the electron beam drawing mask blank in any of the fourteenth to twenty fifth aspects is characterized in that either at least one layer of the pattern supporting layer, the etching stopper layer and the electron beam scattering layer is stress-controlled by a heat treatment, or at least two layers are simultaneously subjected to a heat treatment to control the film stress thereby to reduce the total film stress.

(Twenty-seventh Aspect)

According to a twenty-seventh aspect of the present invention, an electron beam drawing mask is characterized in that it is manufactured by using the mask blank in any of the first to twenty sixth aspects.

(Twenty-eighth Aspect)

According to a twenty-eighth aspect of the present invention, there is provided an electron beam drawing mask comprising: pattern supporting film (or an electron beam transmitting film) for transmitting an electron beam therethrough; an electron beam scattering body pattern formed over the pattern supporting film; and a support member for supporting the pattern supporting film and the electron beam scattering body pattern. The electron beam drawing mask is characterized: in that the pattern supporting film has a film thickness of 0.005 to 0.2 micron, a film material density of 1.0 to 5.0 g/cm$^3$ and an elastic modulus of $0.8 \times 10^{11}$ Pa or higher; and in that the electron beam scattering body pattern has a film thickness of 0.2 to 2 micron, a film material density of 1.0 to 5.0 g/cm$^3$, and an elastic modulus of $0.8 \times 10^{11}$ Pa or higher.

(Twenty-ninth Aspect)

According to a twenty-ninth aspect of the present invention, there is provided an electron beam drawing mask comprising: an pattern supporting film (or an electron beam transmitting film) for transmitting an electron beam therethrough; an electron beam scattering body pattern formed over the pattern supporting film; and a support member for supporting the pattern supporting film and the electron beam scattering body patter. The electron beam drawing mask is characterized in that at least one of the support member, the pattern supporting film and the electron beam scattering body pattern is made of a material composed substantially of the carbon element.

(Thirtieth Aspect)

According to a thirtieth aspect of the present invention, there is provided an electron beam drawing mask comprising: a pattern supporting film (or an electron beam transmitting film) for transmitting an electron beam therethrough; an electron beam scattering body pattern formed over the pattern supporting film; an etching stopper layer formed all over the pattern supporting film or left under the electron beam scattering body pattern; and a support member for supporting the pattern supporting film, the etching stopper layer and the electron beam scattering body pattern. The electron beam drawing mask is characterized: in that the electron beam scattering body pattern is made of either a DLC or a material containing a DLC doped with at least one of B, N, Si and P; in that the pattern supporting film is made of either a DLC or a material containing a DLC doped with at least one of B, N, P, Ti, Si and Al; and in that the etching stopper layer is made of a material having a high etching selection ratio with the electron beam scattering layer.

(Thirty-first Aspect)

According to a thirty-first aspect of the present invention, there is provided an electron beam drawing mask comprising: a pattern supporting film (or an electron beam transmitting film) for transmitting an electron beam therethrough; an electron beam scattering body pattern formed over the pattern supporting film; and a support member for supporting the pattern supporting film and the electron beam scattering body pattern. The electron beam drawing mask is characterized in that: the electron beam scattering body pattern is made of a material composed substantially of the silicon element; and in that the pattern supporting film is made of SiC or TiC.

(Thirty-second Aspect)

According to a thirty-second aspect of the present invention, there is provided an electron beam drawing mask comprising: a pattern supporting film (or an electron beam transmitting film) for transmitting an electron beam therethrough; an etching stopper layer formed over the pattern supporting film; an electron beam scattering body pattern formed over the etching stopper layer; and a support member for supporting the pattern supporting film, the etching stopper layer and the electron beam scattering body pattern. The electron beam drawing mask is characterized: in that the electron beam scattering body pattern is made of hard carbon; in that the etching stopper layer is made of $SiO_2$; and in that the pattern supporting film is made of a material composed substantially of the silicon element.

(Thirty-third Aspect)

According to a thirty-third aspect of the present invention, there is provided an electron beam drawing mask comprising: a pattern supporting film (or an electron beam transmitting film) for transmitting an electron beam therethrough; an electron beam scattering body pattern formed over the pattern supporting film; and a support member for supporting the pattern supporting film and the electron beam scattering body pattern. The electron beam drawing mask is characterized: in that the electron beam scattering body pattern is made of either a DLC or a material containing a DLC doped with at least one of B, N, Si and P; in that the pattern supporting film is made of β-SiC.

(Thirty-fourth Aspect)

According to a thirty-fourth aspect of the present invention, there is provided an electron beam drawing mask comprising: a pattern supporting film (or an electron beam transmitting film) for transmitting an electron beam therethrough; an electron beam scattering body pattern formed over the pattern supporting film; and a support member for supporting the pattern supporting film and the electron beam scattering body pattern. The electron beam drawing mask is characterized: in that the electron beam scattering body pattern is made of a material composed substantially of the silicon element; and in that the pattern supporting film is made of SiC.

(Thirty-fifth Aspect)

According to a thirty-fifth aspect of the present invention, there is provided an electron beam drawing mask comprising: a pattern supporting film (or an electron beam transmitting film) for transmitting an electron beam therethrough; an electron beam scattering body pattern formed over the pattern supporting film; and a support member for supporting the pattern supporting film and the electron beam scattering body pattern. The electron beam drawing mask is characterized: in that the electron beam scattering body pattern is made of a material composed substantially of the silicon element; and in that the pattern supporting film is made of either a DLC or a material containing a DLC doped with at least one of B, N, P, Ti, Si and Al.

(Thirty-sixth Aspect)

According to a thirty-sixth aspect of the present invention, the electron beam drawing mask in any of the twenty seventh to thirty fifth aspects is characterized in that the electron beam drawing mask is used at an acceleration voltage of an exposure electron beam of 30 KeV or higher.

(Thirty-seventh Aspect)

According to a thirty-seventh aspect of the present invention, there is provided a method for manufacturing an electron beam drawing mask, characterized by comprising the step of forming at least one of a compressive stress film and a tensile stress film on the surface side or back side of the electron beam drawing mask in any of the twenty seventh to thirty sixth aspects.

(Thirty-eighth Aspect)

According to a thirty-eighth aspect of the present invention, there is provided a method for manufacturing an electron beam drawing mask, characterized by comprising the steps of: subjecting an SIMOX wafer or an adhered SOI wafer to a wind treatment from the back side; subsequently removing a stopper layer (or an intermediate layer) in the water selectively; and forming a pattern supporting film (or an electron beam transmitting film) on one side from the back side by a thin film forming method.

(Thirty-ninth Aspect)

According to a thirty-ninth aspect of the present invention, there is provided a semiconductor device characterized in that it is manufactured by using an electron beam drawing mask in any of the twenty seventh to thirty sixth aspects.

According to the foregoing first aspect, there can be attained the following effects. Where the electron beam scattering layer is made of a material composed substantially of a metallic element such as Mo or W as in the SCALPEL of the prior art, as has been described hereinbefore, the pattern supporting layer (of SiN or the like) having the minimum necessary film thickness is required for supporting the electron beam scattering layer. However, this requirement causes a problem that the resolution is deteriorated by the color aberration resulting from the energy loss or energy dispersion in the pattern supporting layer. According to the first aspect, on the other hand, the electron beam scattering layer is made of the "material composed substantially of the carbon element and/or the silicon element", so that the film thickness of the pattern supporting layer can be reduced to lighten the aforementioned problems. Here, the "material composed substantially of the carbon element and/or the silicon element" covers the case in which the material contains one kind or two or more kinds of B, P, H, N, O and halogens and the case in which the material is doped additionally or solely with a trace amount of metallic element.

According to the second aspect, the electron beam scattering layer in the first aspect is limited to the case in which it is made of a "material composed substantially of the carbon element". Here, the "material composed substantially of the carbon element" is desired to be such a material as has a component having a low film material density and high material strength characteristics such as the Young's modulus and capable of making the electron beam scattering body as thick as possible, as is excellent in the chemical resistance and the irradiation resistance and as can be excellently etched from the viewpoint of the pattern precision. In addition, the "material composed substantially of the carbon element" is preferably other than the insulating material while considering the charge. The material satisfying the above-specified characteristics is exemplified by diamond, diamond like carbon (DLC) or hard carbon. The film of these materials can contain nitrogen, boron, silicon or phosphor.

The third aspect limits the electron beam scattering layer in the second aspect to the case in which it is made of the "the DLC or the DLC doped with at least one of B, N, Si and Pa". By this doping the DLC with at least one of B, N, Si and P, the DLC can be given a conductivity to avoid the influence of the charging or the like. The DLC constructing the electron beam scattering layer is preferred to have a film thickness of about 300 to 700 nm.

In the fourth aspect, if the doping of the DLC with at least one of B, N, Si and P exceeds 40 mole %, it may occur that the properties of the DLC film or the etching selectivity are deteriorated. If the doping is less than 0.1 mole %, on the other hand, it may occur that the effects of giving the conductivity by the doping or the reducing the film resistance are not sufficient.

According to the fifth aspect, the electron beam scattering layer in the first aspect is limited to the case in which "it is made of a material composed substantially of the silicon element". Here, the "material composed substantially of the silicon element" is exemplified by amorphous silicon, polycrystalline silicon or single crystal silicon. These materials may be individually doped with B or P.

According to the sixth aspect, the pattern supporting layer in the first to fifth aspects is limited to the case in which "it is made of a material composed substantially of the carbon element". Here, the "material composed substantially of the carbon element" is desired to be such a material as has a component having a low film material density and high material strength characteristics such as the Young's modulus and capable of making the electron beam scattering body as thick as possible, as is excellent in the chemical resistance and the irradiation resistance and as can be excellently etched from the viewpoint of the pattern precision. In addition, the "material composed substantially of the carbon element" is preferably other than the insulating material while considering the charge. The material satisfying the above-specified characteristics is exemplified by diamond, diamond like carbon (DLC) or hard carbon. The film of these materials can contain nitrogen, boron, silicon or phosphor.

According to the seventh aspect, the pattern supporting layer in the sixth aspect is limited to the case in which "it is made of a material of the DLC or the DLC doped with at least one of B, N, P, Ti, Si and Al". Here, by doping the DLC with at least one of B, N, P, Ti, Si and Al, the DLC can be given the conductivity to avoid the influence of the charging or the like.

According to the eighth aspect, if the doping of the DLC with at least one of B, N, P, Ti, Si and Al exceeds 40 mole %, it may occur that the properties of the DLC film or the etching selectivity is deteriorated. If the doping is less than 0.1 mole %, on the other hand, it may occur that the effects of giving the conductivity by the doping or reducing the film resistance cannot be sufficiently obtained.

Here will be described the reasons why the elements the DLC is to be doped are different between the electron beam scattering layer in the third aspect and the pattern supporting layer in the eighth aspect. The electron beam scattering layer has to be etched to form the pattern so that the doping element is restricted not to deteriorate the etching characteristics. For the pattern supporting layer, on the other hand, a wider range of doping elements can be selected for improving the mechanical strength. If the DLC making the electron beam scattering layer is doped with the Ti or Al which is accepted by the pattern supporting layer, it unpreferably forms a film which is hard to etch.

According to the ninth aspect, the pattern supporting layer in the first to fifth aspects is limited to the case in which "it is made of a material composed substantially of the silicon element". Here, the "material composed substantially of the silicon element" is exemplified by amorphous silicon, polycrystalline silicon or single crystal silicon. These materials may be individually doped with B or P.

According to the tenth aspect, the etching stopper layer is sandwiched between the electron beam scattering layer and the pattern supporting layer so that the pattern supporting layer can be prevented from being etched when the electron beam scattering layer is etched to form the pattern, thereby to enhance the margin at the working time. After the pattern formation, on the other hand, the film stress balance of the pattern region can be made to provide a stabler mask. Here, after the pattern formation, the etching stopper layer to be exposed from the opening of the electron beam scattering layer may or may not be removed.

When the support member is to be etched from the back side, on the other hand, the etching stopper layer is sandwiched between the pattern supporting layer and the support member so that the pattern supporting layer can be prevented from being etched from the back side, to enhance the margin at the working time. After the pattern was formed on the electron beam scattering layer, on the other hand, the film stress balance of the pattern region can be adjusted to provide a stabler mask.

Here, the etching stopper layers of the aforementioned two kinds may be made of an identical material or different materials.

Here in the mask blank according to the present invention, the support member covers both the substrate made of the support member material and the support member which is obtained by working the substrate of the support member material from the back side. This applied to the first to twenty sixth aspects.

As defined in the eleventh aspect, the etching stopper layer is preferably made of a material having a high etching selection ratio to the electron beam scattering layer and/or the support member. At the higher etching selection ratio, the electron beam scattering layer and/or the support member can be more prevented from being etched. The material for the etching stopper layer is exemplified by SiC, TiC, TiN, amorphous Si, Ti, Al or $SiO_2$. The etching stopper layer has a film thickness preferably of 0.005 to 0.2 micron and more preferably of about 10 to 20 nm.

As defined in the twelfth aspect, the support member is made of a material composed substantially of the carbon element to make such an etching possible as having an extremely high etching selectivity of 100 or higher with respect to the etching stopper layer or the like. As a result, the material selectivity can be widened to make the etching stopper layer remarkably thin thereby to provide an ideal mask blank with a surplus workability.

In the thirteenth aspect, by making the individual layers of the materials as presented in the thirteenth aspect, it is easy to improve the etching selectivity, i.e., to retain the process margin. Since a laminated structure of materials of similar kinds is made through the etching stopper layer, on the other hand, the material characteristics are so similar that the coefficient of thermal expansion and the thermal conductivity can be made similar. As a result, it is possible to suppress the dispersion of the thermal distortion. Moreover, the working conditions such as the etching condition can be easily selected.

By this doping the DLC with at least one of B, N, Si and P, the DLC can be given a conductivity to avoid the influence of the charging or the like. The DLC constructing the electron beam scattering layer is preferred to have a film thickness of about 300 to 700 nm.

Here, the DLC making the pattern supporting layer can be doped with at least one of B, N, P, Ti, Si and Al thereby to give the DLC the conductivity and the tensile stress. The DLC making the pattern supporting layer preferably has a film thickness of about 30 to 80 nm.

The etching stopper layer is similar to that of the eleventh aspect.

Here, the method of doping the DLC making the pattern supporting layer and the DLC making the electron beam scattering layer with another element is exemplified by the method of doping the filmed DLC by the ion implantation method. For this method, however, facilities dedicated to the ion implantation have to be introduced. From the viewpoint of simplifying the process or the like, the preferable method is to dope the DLC being filmed with another element.

Here, the DLC making the pattern supporting layer and the DLC making the etching stopper layer and the electron beam scattering layer are preferred to be continuously filmed because it is possible to reduce the particles.

If the DLC making the pattern supporting layer and the DLC making the electron beam scattering layer are filmed by the film forming method of excluding hydrogen therefrom, on the other hand, the thermal conductivity is preferably improved (better than the excellent thermal conductivity of the single crystal Si). The film forming method of this known kind is exemplified by the negative ion beam sputtering method, the opposed target sputtering method or the ECR-sputtering method. If hydrogen is contained in the DLC, the trailing end of the diamond bond is terminated to cut the network structure of the film. This unpreferably lowers the thermal conductivity characteristics and the Young's modulus.

From the requirement for the material satisfying the predetermined film thickness relation, the fourteenth aspect excludes the case in which the electron beam scattering layer is made of a heavy metal. This is because the mask made of the materials satisfying the aforementioned film thickness relation cannot be realized where the electron beam scattering layer is made of the heavy metal. It follows that there is excluded the mask having the construction in which the metallic electron beam scattering layer of W or Mo is supported by the pattern supporting layer, such as the SCALPEL mask of the prior art.

The exposure electron beam loss depends substantially on the film thickness and the film material density of the pattern supporting layer. The exposure electron loss (%) is determined from the following Formula:

$$(1-e^{-(Tt/\alpha)}) \times 100,$$

wherein: Tt indicates the film thickness of the pattern supporting layer; and $\alpha$ indicates the mean free path of the electrons in the pattern supporting layer. On the other hand, (Tt/$\alpha$) indicates the film thickness for the electrons to scatter one time.

As the film material density grows the higher, the mean free path a becomes the smaller, and the exposure electron loss also becomes the smaller.

Where the film material density is 1 g/cm$^3$, the exposure electron loss is about 45% if the film thickness is 0.2 micron. If the film thickness of the pattern supporting layer exceeds 0.2 micron, therefore, one half or more of the exposure electrons will be lost to deteriorate the exposure efficiency impractically.

On the other hand, a deflection $\delta$ of the pattern supporting layer has to be within $\delta \leq$ DOF (focal depth). For a DOF of 2 to 3 micron, the deflection $\delta$ is determined from the following Formula:

$$\delta = (k \times W \times a^4)/(E \times Tt^3) \leq 2 \text{ (micron)},$$

wherein: k indicates a (known) deflection coefficient; W indicates a force (or known as its own weight) to act on the film; a indicates a (known) length of one side of the pattern field; and E indicates the Young's modulus of the pattern supporting layer.

In order to reduce the deflection $\delta$, therefore, it is sufficient to enlarge the term $(E \times Tt^3)$.

Here, the letter E indicates the Young's modulus (the maximum: 500 GPa for the film material) of the DLC. Then, it is difficult to make the deflection $\delta$ no more than 2 micron if the pattern supporting layer has a film thickness of 0.005 micron or more.

Where the pattern supporting layer has a thickness less than 0.005 micron, on the other hand, it cannot sufficiently support the electron beam scattering layer formed thereover, so that a sufficient film stability cannot be obtained. Moreover, the dislocation of the pattern position may be invited by the change, as may be caused at the time of etching the electron beam scattering layer, in the stress distribution in the vicinity of the pattern.

The pattern supporting layer has preferably a thickness of 0.005 to 0.2 micron, more preferably a thickness of 0.005 to 0.1 micron, and more preferably a thickness of 0.01 to 0.05 micron.

Where the electron beam scattering layer has a thickness less than 0.2 micron, as made of a light element, the scattering number of electrons in the electron beam scattering layer is not so sufficient that a satisfactory beam contrast cannot be achieved. In the case of the leaf pattern, on the other hand, a sufficient film self-sustainability cannot be achieved. If the thickness of the electron beam scattering layer exceeds 2 micron, on the other hand, the scattering number of electrons in the electron beam scattering layer is so large that the control of the scattering angle of electrons may become difficult. With the difficulty in the control of the scattering angle of electrons, the electron scattering angle distribution becomes too large, when auxiliary exposure means such as the GHOST method is adopted to correct the proximity effect, to perform a satisfactory auxiliary exposure. For the electron beam scattering layer, on the other hand, a fine pattern is formed by the anisotropic dry-etching method, for example. As the etching depth of the electron beam scattering layer becomes the larger, however, there impreferably arises the tendency to deteriorate the working precision of the electron beam scattering layer. This electron beam scattering layer has a preferable thickness range of 0.3 to 1.5 micron.

When both the pattern supporting layer and the electron beam scattering layer have film thicknesses within the above-specified ranges, the film stability is kept for the mask. On the other hand, the transmission and the scattering of electrons can be controlled to improve the throughput at the exposure time.

According to the fifteenth aspect, if the pattern supporting layer satisfies the following Relation (1), it is possible to suppress the scattering of electrons thereby to lower the exposure electron loss and to improve the exposure efficiency:

$$Tt \leq 2\alpha \qquad (1).$$

Preferably $Tt \leq \alpha$

In the sixteenth aspect, where the film thickness is less than $2\beta$, i.e., where the electron beam scattering layer does not have such a film thickness as to allow at least two times of electron scattering, it is impossible to achieve a satisfactory beam contrast on the wafer. If the film thickness exceeds $10\beta$, on the other hand, the scattering times of electrons in the electron beam scattering layer may become so many as to make it difficult to control the scattering angle of electrons. In the difficulty to control the scattering angle, the electron scattering angle distribution becomes so large, when the auxiliary exposure means such as the GHOST method is adopted to make the proximity effect correction, as to make it difficult to perform a satisfactory auxiliary exposure. For the electron beam scattering layer, on the other hand, the fine pattern is formed by the anisotropic dry-etching method, for example. As the etching depth grows the deeper, however, there arises a tendency to deteriorate the working precision, and it is not preferable to make the electron beam scattering layer thicker than $10\beta$.

In the seventeenth aspect, the "film material density" means that the density of the material itself making the pattern supporting layer or the electron beam scattering layer.

In the case of the pattern supporting layer, the probability for the electrons to transmit through the pattern supporting layer without any dispersion is expressed by the following Formula:

$$e^{-(Tt/\alpha)}.$$

As the film material density grows the higher, the mean free path $\alpha$ becomes the smaller. In order to achieve a desired exposure electron amount, therefore, the film thickness of the pattern supporting layer has to be reduced so as to enhance the probability $e^{-(Tt/\alpha)}$ for the electrons to pass through the pattern supporting layer without any dispersion.

However, the film thickness has to be within the range (0.005 to 0.2 micron) defined in the fourteenth aspect. For this necessity, the film material density of the pattern supporting layer has an upper limit of 5.0 g/cm$^3$ and a lower limit of 1.0 g/cm$^3$.

In the case of the electron beam scattering layer, several or more scattering operations are necessary for a beam contrast of 90% or higher. In this case, in dependence upon the material density, the film thickness for one scattering changes so that it can be made the smaller for the higher material density. For the lower material density, on the contrary, the film thickness becomes the larger. As described above, moreover, the film thickness has to be within the range (0.2 to 2 micron) defined in the fourteenth aspect, so that the film material density of the electron beam scattering layer has the upper limit of 5.0 g/cm$^3$ and the lower limit of 1.0 g/cm$^3$.

Since both the film material density of the pattern supporting layer and the electron beam scattering layer are within the above-specified ranges, the individual films have the self-sustainability. Unlike the construction that the electron beam scattering layer made of the metal such as W or Mo is supported by the electron beam transmitting layer like the SCALPEL mask of the prior art, therefore, no deflection occurs in the individual layers themselves and between the layers in the case of the present invention. Even if the electron beam scattering layer is etched to form the patter, on the other hand, the pattern position change is hardly invited because of the small deflection change.

In the eighteenth aspect, if the elastic moduli of the pattern supporting layer and the electron beam scattering layer are individually less than $0.8 \times 10^{11}$ Pa, the individual films may be unable to keep their self-sustainabilities to fail to form the stable mask.

From the viewpoint of the mask stability, it is preferable that the elastic moduli of both the pattern supporting layer and the electron beam scattering layer are $0.8 \times 10^{11}$ Pa or higher, and it is more preferable that the same are $1.0 \times 10^{11}$ Pa or higher.

In the nineteenth aspect, i the dispersion of the film thickness in the one-shot area of the pattern supporting layer exceeds 30% with respect to the set film thickness, the dispersion of the exposure electron amount may become large to invite the deterioration in the exposure characteristics. The dispersion of the film thickness of the pattern supporting layer is preferable to be less than $\pm 10\%$.

If the dispersion of the film thickness of the electron beam scattering layer exceeds 30%, the scattering angle of electrons may become difficult to control thereby to perform the auxiliary exposure effectively. On the other hand, the precision may be influenced in the patterning by the etching. The dispersion of the film thickness of the electron beam scattering layer is more preferable to be less than $\pm 10\%$.

According to the twentieth aspect, there are obtained the following effects. Where the electron beam scattering layer is made of a material composed substantially of a metallic element such as Mo or W as in the SCALPEL mask of the prior art, it has to be supported by the pattern supporting layer (of SiN or the like) having the minimum necessary film thickness for the support. However, there arises a problem that the resolution is degraded by the color aberration resulting from the energy loss or energy dispersion in the pattern supporting layer. By making the electron beam scattering layer of a "material composed substantially of the carbon element and/or the silicon element" as in the twentieth aspect, however, the film thickness of the pattern supporting layer can be reduced to diminish the aforementioned problems.

Here, the "material composed substantially of the carbon element and/or the silicon element" covers the case in which the material contains one kind or two or more kinds of B, P, H, N, O and halogens and the case in which the material is doped additionally or solely with a trace amount of metallic element.

The "material composed substantially of the carbon elements" is desired to be such a material as has a component having a low film material density and high material strength characteristics such as the Young's modulus and capable of making the electron beam scattering body as thick as possible, as is excellent in the chemical resistance and the irradiation resistance and as can be excellently etched from the viewpoint of the pattern precision. In addition, the "material composed substantially of the carbon element" is preferably other than the insulating material while considering the charge. The material satisfying the above-specified characteristics is exemplified by diamond, diamond like carbon (DLC) or hard carbon. The film of these materials can contain nitrogen, boron, silicon or phosphor.

The "material composed substantially of the silicon element" is exemplified by amorphous silicon, polycrystalline silicon or single crystal silicon. These materials may be individually doped with B or P.

In the twenty-first aspect, the etching stopper layer is sandwiched between the electron beam scattering layer and the pattern supporting layer so that the pattern supporting layer can be prevented from being etched when the electron beam scattering layer is etched to form the pattern, thereby to enhance the margin at the working time. After the pattern formation, on the other hand, the film stress balance of the pattern region can be made to provide a stabler mask. Here, after the pattern formation, the etching stopper layer to be exposed from the opening of the electron beam scattering layer may or may not be removed.

When the support member is to be etched from the back side, on the other hand, the etching stopper layer is sandwiched between the pattern supporting layer and the support member so that the pattern supporting layer can be prevented from being etched from the back side, to enhance the margin at the working time. After the pattern was formed on the electron beam scattering layer, on the other hand, the film stress balance of the pattern region can be adjusted to provide a stabler mask.

Here, the etching stopper layers of the aforementioned two kinds may be made of an identical material or different materials.

In the twenty-second aspect, if the film thickness of the etching stopper layer is less than 0.005 micron, a sufficient etching stopper effect cannot be expected. If the film thickness exceeds 0.2 micron, on the other hand, the deflection of the pattern region may be invited by the action of the film stress of the etching stopper layer itself.

In the twenty-third aspect, the reason for the limitation of the film material density in the etching stopper layer is similar to that in the pattern supporting layer mentioned in relation to the seventeenth aspect.

In the twenty-fourth aspect, the etching stopper layer is sandwiched between the electron beam scattering layer and the pattern supporting layer so that the pattern supporting layer can be prevented from being etched when the electron beam scattering layer is etched to form the pattern, thereby to enhance the margin at the working time. After the pattern formation, on the other hand, the film stress balance of the pattern region can be made to provide a stabler mask. Here, after the pattern formation, the etching stopper layer to be exposed from the opening of the electron beam scattering layer may or may not be removed.

When the support member is to be etched from the back side, on the other hand, the etching stopper layer is sandwiched between the pattern supporting layer and the support member so that the pattern supporting layer can be prevented from being etched from the back side, to enhance the margin at the working time. After the pattern was formed on the electron beam scattering layer, on the other hand, the film stress balance of the pattern region can be adjusted to provide a stabler mask.

Here, the etching stopper layers of the aforementioned two kinds may be made of an Identical material or different materials.

In the twenty-fifth aspect, the surface roughness (Ra) of each layer is made no more than 10 nm. This is because the edge roughness characteristics of the mask pattern such as the electron beam scattering pattern and the exposures are adversely affected if those layers have the rough surfaces. As one reason, more specifically, it the surfaces of the layers underlying the resist layer are rough at the resist pattern formation of mask manufacturing time, the edge roughness characteristics of the resist pattern may be deteriorated by the secondary electrons coming from those layers. Still the worse, the side walls of the electron beam scattering pattern are roughed to adversely affect the edge roughness of the mask pattern.

As another reason, the pattern supporting layer (may include the etching stopper layer) is so thin (at about 50 nm) that the surface roughness at the level of 5 nm or 10 nm causes a local film thickness roughness. This film thickness dispersion causes an excessive electron scattering in the portion of the electron beam scattering body so that the exposure pattern shape is deteriorated by the stored charge effect at the electron beam scattering body pattern portion.

In order to suppress the exposure dispersion within 5% at the real transfer time, the exposure electron distribution in one shot has to be made better. In the film material of the present invention, about 60 to 80% of the electrons incident on the mask contribute as the exposure electrons. The remaining about 30% is cut. Where the surface roughness is 10 nm for the thickness of 50 nm of the pattern supporting layer, for example, it corresponds to the film thickness dispersion of about 20% with respect to the film thickness. With a large film thickness dispersion, there is enlarged the dispersion of the ratio of the exposure electrons and accordingly the exposure dispersion at the real exposure time.

The local dispersion in one shot cannot be basically corrected so that the surface roughness has a high influence. In order that the influences of the surface roughnesses of the individual layers may be reduced more, the surface roughnesses of the individual layers are preferably no more than 5 nm and more preferably no more 2 nm.

In relation to the line width of the electron beam scattering body pattern, the surface roughness of the etching stopper layer or the pattern supporting layer is preferred to be no more than $1/100$ of the line width of the electron beam scattering pattern. Where the electron beam scattering pattern has a line width no more than 0.2 micron, more specifically, the surface roughness of the etching stopper layer or the pattern supporting layer is preferred to be no more than 2 nm. Thus, the aforementioned problems can be solved.

Where the pattern supporting layer and the electron beam scattering layer are made of the DLC, for example, the surface roughnesses (Ra) of the pattern supporting layer and the electron beam scattering layer can be made no more than 2 nm by selecting and controlling the film forming method and the film forming conditions.

The pattern supporting layer is preferably made of a material having a high Young's modulus because it is required to have the film self-sustainability. For example, the diamond film has a high Young's modulus (i.e., 500 GPa). However, it is difficult to make the surface roughness of the diamond film no more than 2 nm and accordingly to avoid the aforementioned influences of the surface roughness. It is conceivable to polish and smooth the diamond film after filmed. However, the diamond is an extremely hard material to have a poor polishing efficiency, and its film is easily damaged even polished so that it has a poor practical value.

Here, an excessive electron scattering occurs in the electron beam scattering layer, too, and the exposure pattern shape is deteriorated by the storage charge effect at the electron beam scattering body pattern portion. Thus, the surface roughness is preferably 10 nm or less.

According to the twenty-sixth aspect, the stresses of the individual layers can be subjected individually or altogether to a heat treatment (or annealed) to lower the total film stress. The atmosphere for this heat treatment is preferably exemplified by the vacuum which is established by evacuating it in a vacuum apparatus, or by the atmosphere which is evacuated and then supplied in the vacuum apparatus with an inert gas such as He or Ar or at least one kind of the gases of $H_2$, $N_2$ and so on.

The heat treatment temperature is suitably selected from a proper temperature range in terms of the in-film hydrogen concentration, but is preferred for the case of the DLC to be higher by 200 to 450° C. than the substrate temperature at the DLC film forming time.

According to the twenty-seventh aspect, if the mask is manufactured by using the aforementioned mask blank according to the present invention, it is possible to provide an electron beam drawing mask which is excellent in the structural characteristics, the manufacturing characteristics and the lithography required characteristics.

According to the twenty-eighth aspect, if the film thicknesses, the film material densities and the elastic moduli of the pattern supporting layer and the electron beam scattering layer are specified, it is possible to provide an electron beam drawing mask which is excellent in the structural characteristics, the manufacturing characteristics and the lithography required characteristics.

According to the twenty-ninth aspect, if at least one of the support member, the pattern supporting film and the electron beam scattering body pattern layer is made of a material composed substantially of the carbon element such as the DLC or the hard carbon, it is possible to provide an electron beam drawing mask which is excellent especially in the structural characteristics, the manufacturing characteristics and the lithography required characteristics.

According to the thirtieth aspect, by making the individual layers of the materials specified in the thirtieth aspect, it is easy to improve the etching selectivity, i.e., to retain the process margin. On the other hand, the laminated structure of similar materials is obtained through the etching stopper layer so that the material characteristics resemble. As a result, the thermal expansion coefficients, the thermal conductivities and so on can be made similar so that the dispersion can be suppressed against the thermal distortion. Moreover, it is easy to select the working conditions such as the etching conditions.

As has been described hereinbefore, the DLC making the electron beam scattering pattern can be doped with at least one of B, N, Si and P. As a result, the DLC can be given the conductivity to avoid the mask charging influences. The DLC making the electron beam scattering body pattern is preferred to have a film thickness of about 300 to 700 nm.

The etching stopper layer is preferably made of a material hard to etch with an acidic gas so that it may etch the DLC making the electron beam scattering body pattern with the oxidizing gas. This material is exemplified by SiC, TiC, TiN, amorphous Si, Ti and Al. The etching stopper layer has a film thickness preferably of 0.005 to 0.2 micron and more preferably of about 10 to 20 nm. Where the etching stopper layer is left below the electron beam scattering body pattern, the exposed etching stopper layer may be etched off after the electron beam scattering body pattern was formed.

The DLC making the pattern supporting film can be doped with at least one of B, N, P, Ti, Si and Al so that the DLC can be given the conductivity and the tensile stress. The DLC making the pattern supporting film has a film thickness preferably of about 30 to 80 nm.

Here, the method of doping the DLC making the pattern supporting film and the DLC making the electron beam scattering body pattern with another element is exemplified by the method of doping the filmed DLC by the ion implantation method. For this method, however, facilities dedicated to the ion implantation have to be introduced. From the viewpoint of simplifying the process or the like, the preferable method is to dope the DLC being filmed with another element.

Here, the DLC making the pattern supporting film and the DLC making the etching stopper layer and the electron beam scattering body pattern are preferred to be continuously filmed because it is possible to reduce the particles.

If the DLC making the pattern supporting film and the DLC making the electron beam scattering body pattern are filmed by the film forming method of excluding hydrogen therefrom, on the other hand, the thermal conductivity is preferably improved (better than the excellent thermal conductivity of the single crystal Si). The film forming method of this known kind is exemplified by the negative Ion beam sputtering method, the opposed target sputtering method or the ECR-sputtering method. If hydrogen is contained in the DLC, the trailing end of the diamond bond is terminated to cut the network structure of the film. This unpreferably lowers the thermal conductivity characteristics and the Young's modulus.

The thirty-first to thirty-fifth aspects are presented to exemplify the mask construction of the embodiments to be described hereinafter. The thirty-first aspect presents the mask construction of Embodiment 1; the thirty-second aspect presents the mask construction of Embodiment 2; the thirty-third aspect presents the mask construction of Embodiment 3; the thirty-fourth aspect presents the mask construction of Embodiment 4; and the thirty-fifth aspect presents the mask construction of Embodiment 6.

Here in the thirty-first, thirty-second, thirty-fourth and thirty-fifth aspects, the material composed substantially of the silicon element is exemplified by amorphous silicon, polycrystalline silicon or single crystal silicon. These materials may be individually doped with B or P.

The thirty-sixth aspect regulates the specifications of the electron beam drawing mask on the acceleration voltage of the exposure electron beam. For different specifications of the acceleration voltage, the required characteristics for the mask are naturally different The mask satisfying these specifications can be employed at the high acceleration voltage in the SCALPEL system, for example.

According to the thirty-seventh aspect, there is provided a method for manufacturing an electron beam drawing mask, characterized by comprising the step of forming at least one of a compressive stress film and a tensile stress film on the surface side or back side of the electron beam drawing mask in any of the twenty-seventh to thirty-sixth aspects. As a result, the stress balance of the pattern region can be controlled after the mask was manufactured.

According to the thirty-eighth aspect, there is provided a method for manufacturing an electron beam drawing mask, characterized by comprising the steps of: subjecting an SIMOX wafer to a wind treatment from the back side; subsequently removing the stopper $SiO_2$ layer in the SIMOX wafer selectively; and forming a pattern supporting film from the back side by the thin film forming method. It follows that the thickness of the pattern supporting film can be freely adjusted. Another advantage is that the Si single crystal layer excellent in the dry-etching properties can be used in the electron beam scattering body.

According to the thirty-ninth aspect, by using the electron beam drawing mask according to the present invention, the throughput at the exposure time can be improved to provide a semiconductor device such as a superhigh integrated circuit or a semiconductor element at a low cost.

BRIEF DESCRIPTION OF THE DRAWINGS

FIGS. 16A to 16E are sectional views showing a process for manufacturing a mask according to one embodiment of the present invention.

PREFERRED EMBODIMENTS OF THE INVENTION

Figure 1:
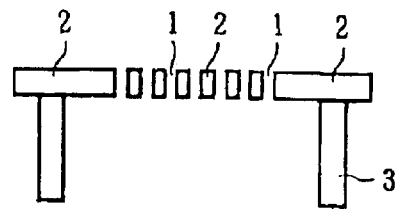
FIG. 1 is a sectional view showing a structure of a stencil mask.
Figure 2A:
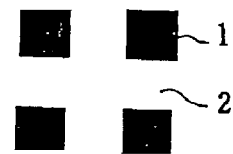
FIGS. 2A and 2B are top plan views for explaining examples of through hole patterns in the stencil mask.
Figure 2B:
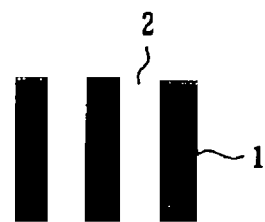
Figure 3A:
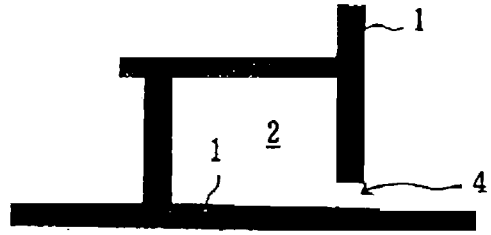
FIGS. 3A and 3B are top plan views for explaining examples of a cantilever pattern in the stencil mask.
Figure 3B:
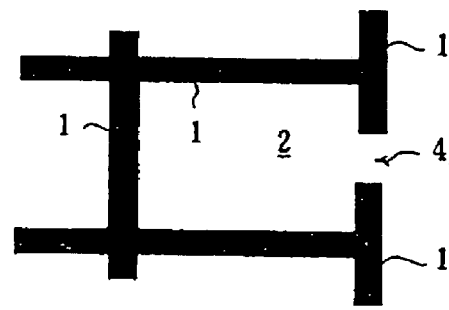
Figure 4:
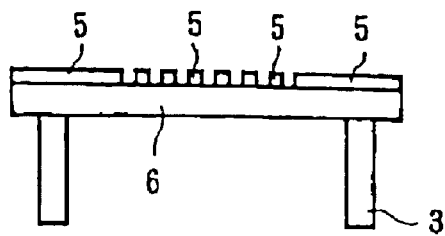
FIG. 4 is a sectional view showing a structure of a SCALPEL mask (electron beam scattering mask)

The present invention is characterized by optimizing the materials, densities, elastic moduli, film thicknesses and so on of an electron beam scattering layer and a pattern supporting layer (or film). More specifically, a mask structure made of an electron beam scattering body, a pattern supporting layer and their supports, for example, is characterized in that the electron beam scattering body and the pattern supporting layer are made of low-density materials to have large material strength characteristics (e.g., the Young's modulus) and to satisfy a predetermined film thickness relation. These characteristics control the transmission and the scattering of the exposure electrons and achieve the film stabilization of the mask (or mask blank) and the improvement in the throughput at the exposure time period.

In order to lower a thermal load on a high acceleration voltage in the aforementioned mask structure, it is preferable to adopt an electron beam scattering body made of a low-density material and to set the thickness of the electron beam scattering body thereby to transmit all the irradiation electrons. On the other hand, a self-sustaining film is made by making the electron beam scattering body of a low-density and high-elasticity material as thick as 0.2 micron or more. In addition, by making the electron beam scattering body as thick as possible under a workable limit, the geometrical moment of inertia is enlarged at a complicated pattern portion (especially at the pattern supporting portion of a leaf pattern). This enlargement reduces the deflection at the pattern having a small sectional area (or a small beam area) of the pattern supporting portion.

By a method of a partial contact with the electron beam scattering layer (or the electron beam scattering body pattern), moreover, a pattern supporting layer is formed of an ultra-thin film having large material strength characteristics such as the Young's modulus. The pattern supporting layer reduces the local deflection of the leaf pattern or the like in the electron beam scattering body pattern and improves the mask field durability in the high-speed mask operation. By making the electron beam scattering layer of the self-sustaining film, specifically, only the leaf pattern or ring pattern forming portion is locally reinforced by the pattern supporting layer. In short, the pattern supporting layer in the mask of the present invention is formed all over the pattern region but is provided for supporting the electron beam scattering body pattern locally and auxiliary from the lower side. Therefore, the present invention is different in the object and the demanded characteristics from the electron beam transmitting layer of the prior art, which has been provided for supporting the electron beam scattering body pattern as a whole.

In this case, too, there has been worried the reduction in the exposure electrons, as accompanying the electron scattering in the aforementioned pattern supporting layer, that is, a considerable amount of energy loss in the pattern region. In the scattering mask using a heavy metal, as exemplified In the prior art, a heavy metal scattering body pattern has to be supported exclusively by the pattern supporting layer on the thickness of the pattern supporting layer for supporting the scattering body pattern. It follows that the example of the prior art is accompanied by the limit to the thickness of the pattern supporting layer so that an elastic scattering or an inelastic scattering occurs to reduce the energy of a beam source and to cause a color aberration due to the energy dispersion.

The mask of the present invention is not limited in the film thickness of the pattern supporting layer for the factor of supporting the electron beam scattering body as a whole but is required to support the locally small-area portion. It follows that the mask of the present invention can be made thinner than the heavy metal scattering body mask of the prior art. In the present invention, the exposure electron loss accompanying the electron scattering can be reduced to 5 to 25% where the pattern supporting layer is made to have a film thickness of 10 to 50 nm. This makes it possible to use a stencil mask having a low exposure electron loss. It is possible to estimate a higher throughput than that of the method of the prior art in which a desired pattern is formed by using a complementary mask for developing a ring pattern or a leaf pattern. It is also possible to reduce the influence of the color aberration due to the dispersion of the beam energy more than that of the SCALPEL mask of the prior art.

In the electron beam scattering mask or the stencil mask, on the other hand, the mask field is finely divided by forming mask supporting pillars. By this division, it is possible to improve the mechanical stability of the mask and the radiation thereby to improve the thermal stability. In this case, the mask supporting pillars are preferred to have a shape as vertical as possible for retaining the pattern region area. There have been proposed several working methods (e.g., Unexamined Published Japanese Patent Application No. 10-261584). However, the mask structure of the present invention is characterized by solving the problems without giving any restriction to the standard mask structure having such vertical mask supporting pillars.

Another problem to be solved is the membrane stress either in the pattern supporting layer or in the scattering body pattern made of the heavy metal, or in the two layers. For this solution, the stress of the heavy metal scattering body layer has to be reduced unlimitedly to zero in the respect of the material construction while controlling the membrane layer stress of SiN or the like to a tensile stress of a predetermined range. However, this control is not only extremely severe but also liable to cause the stress change in the scattering body layer of the heavy metal around the pattern formation by the etching.

In the mask structure of the present invention, the electron beam scattering body pattern becomes the self-sustaining film in other than the ring pattern or the leaf pattern so that the membrane stress control around the formation of the electron beam scattering body pattern is easier than that of the heavy metal scattering body mask, as will be specifically described hereinafter.

As the most important point for realizing the transfer mask structure by such material construction, it is needless to say that the establishment of the high aspect ratio etching technique is indispensable for forming the pattern on the electron beam scattering body layer. However, what makes the mask structure of the present invention possible is the establishment of the unique deep-dug (trench) etching technique.

In the trench etching of an Si material, for example, the mask structure is achieved by developing a high-density type etching apparatus, by optimizing the etching parameters, by making a proper etching chamber material and so on. The characteristics now available are the vertical etching as deep as 3.2 micron for the on-mask pattern size of 0.2 micron that the fundamentals for the technical characteristics are established for satisfying the requisites (for the mask characteristics) of the present invention.

There are a variety of electron beam scattering body materials, as will be described in the following embodiments. It is additionally touched here that the present invention can achieve a high etching selectivity for all those materials and can etch them at a high aspect ratio.

Figure 5A:
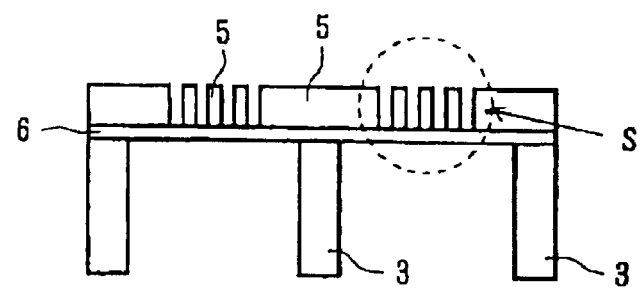
FIG. 5A is a sectional view showing a structure of a mask according to one embodiment of the present invention.
Figure 5B:
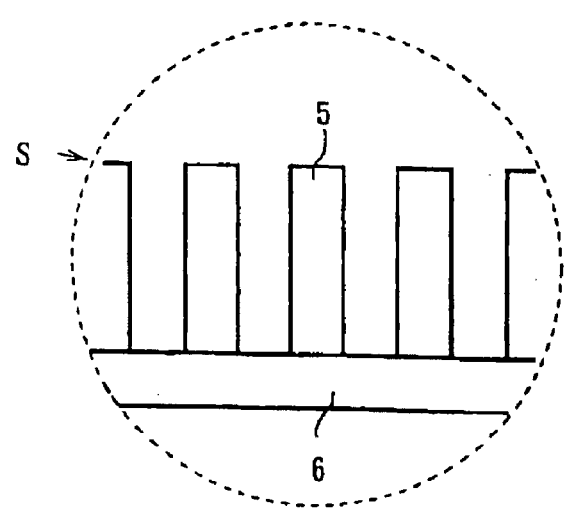
FIG. 5B is a partially enlarged view of FIG. 5A.
Figure 6A:
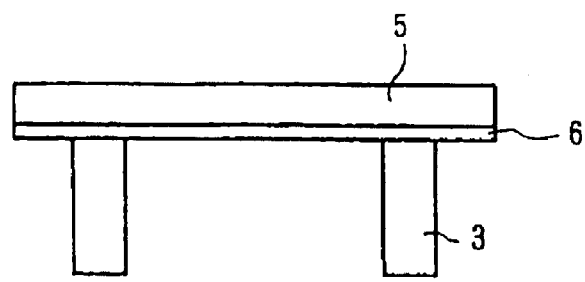
FIGS. 6A and 6B are sectional views showing two aspects of shape of a structure of a mask blank according to the embodiment of the present invention.
Figure 6B:
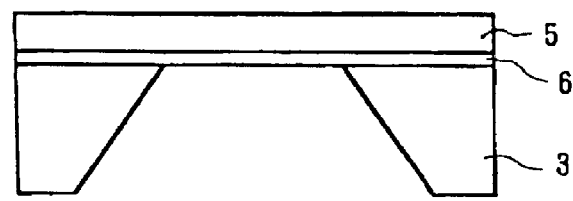
Figure 7A:
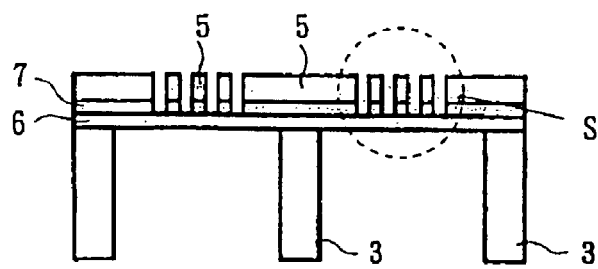
FIG. 7A is a sectional view showing a structure of a mask according to another embodiment of the present invention.
Figure 7B:
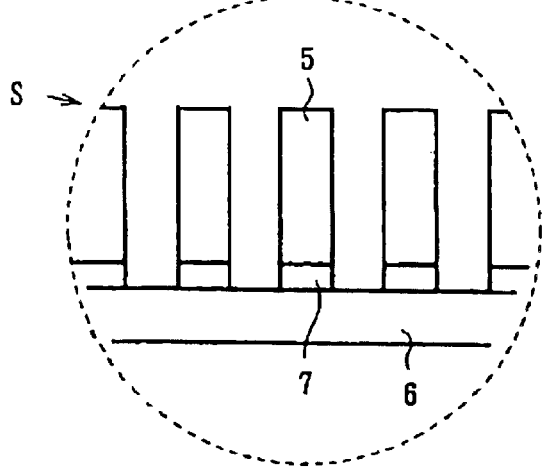
FIG. 7B is a partially enlarged view of FIG. 7A.
Figure 8A:
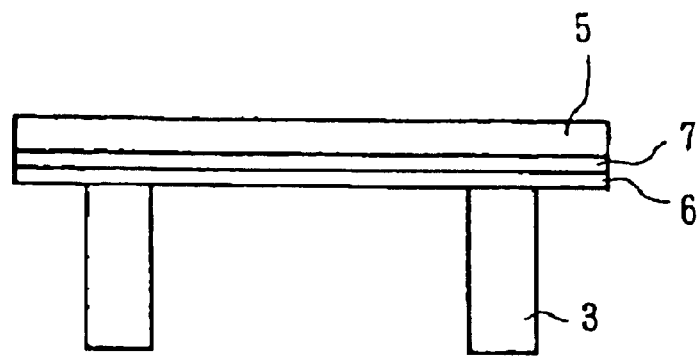
FIGS. 8A and 8B are sectional views showing two aspects of shape of a structure of a mask blank according to another embodiment of the present invention.
Figure 8B:
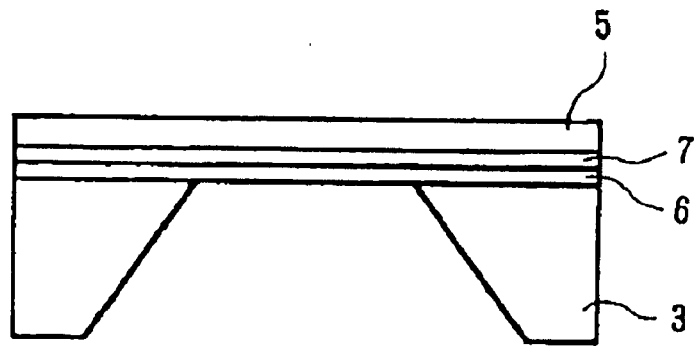

Examples of the structures of the mask and the mask blank of the present invention are shown in FIGS. 5A and 5B to FIGS. 8A and 8B. FIG. 5A is a sectional view showing an example of the mask structure, and FIG. 5B is a partially enlarged view of FIG. 5A. FIGS. 6A and 6B are sectional views showing two aspects of the structural examples of the mask blank. FIG. 7A is a sectional view showing another example of the mask structure, and FIG. 7B is a partially enlarged view of FIG. 7A. FIGS. 8A and 8B are sectional views showing two aspects of other structural examples of the mask blank.

In FIG. 5A, the mask of the present invention includes support members 3, an electron beam scattering layer (or electron beam scattering body pattern) 5, and a pattern supporting layer (or pattern supporting film) 6. The mask shown in FIG. 7A further includes an etching stopper layer 7.

Here, the mask material may be any so long as it can satisfy the mask characteristics of the present invention, but will be described on its representative construction examples and its manufacturing examples.

(Embodiment 1)

Figure 9A:
FIGS. 9A to 9F are sectional views showing a process for manufacturing a mask according to one embodiment of the present invention.
Figure 9B:
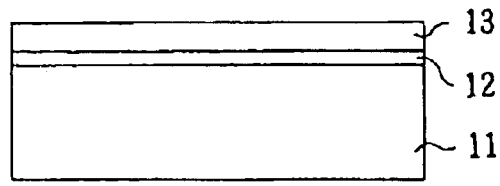
Figure 9C:
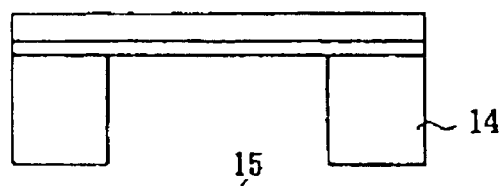

Over a silicon substrate 11, as shown in FIG. 9A, an SiC layer 12 is formed to have a thickness of 0.03 micron as the pattern supporting layer (or film) by the CVD method. Over this SiC layer 12, an amorphous silicon (a-Si) layer 13 is formed (FIG. 9B) to have a thickness of 0.7 micron as the electron beam scattering layer by the CVD method. Subsequently, the back or under side of the substrate 11 is dry-etched to etch the Si thereby to form support members (or support pillars) 14 for supporting the pattern region (FIG. 9C).

Figure 9D:
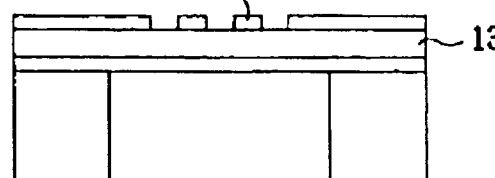

Next, the upper face of the a-Si layer 13 is subjected to a lithography method (by the resist application, by the exposure, by the development and so on) to form a resist pattern 15 having a desired pattern shape (FIG. 9D).

Figure 9E:
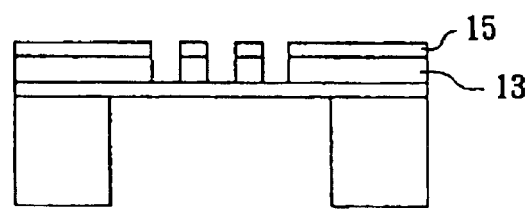

Next, the a-Si layer 13 is etched (or trench-etched) at a high aspect ratio by the high-density plasma etching method (FIG. 9E). The etching selection ratio (SR) at this time is preferred to be as high as possible. In this embodiment the SR of the a-Si/SiC could be a selection ratio as high as about 300 in this embodiment.

Figure 9F:
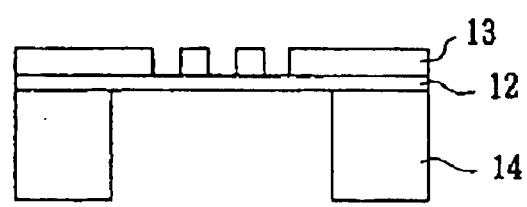

Finally, the resist pattern 15 or the unnecessary layer was removed to leave the mask (FIG. 9F).

Here, the SIC layer 12 that is the pattern supporting layer has a surface roughness (Ra) of 4 nm, and the a-Si layer 13 that is the electron beam scattering layer has a surface roughness (Ra) of 3.3 nm.

The mask thus constructed of the above-specified materials was characterized to have an a-Si film elastic modulus of about $1.0 \times 10^{11}$ (Pa) and to have a self-sustainability. On the other hand, the leaf pattern or ring pattern could be formed by supporting it by the SiC layer having an isotropic elastic modulus of $4.5 \times 10^{11}$ (Pa).

Here, the exposure electron loss of this film thickness construction under 100 KeV was about 21%, which exhibited that the exposure electron loss was about one third or less, as compared with the heavy metal scattering body mask of the film thickness construction.

Figure 10:
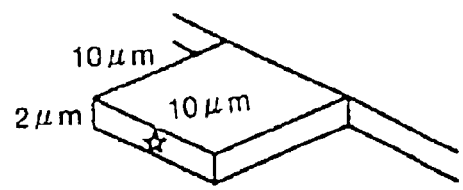
FIG. 10 is a perspective view showing a cantilever pattern.

Here will be considered the pattern deflection of the case in which the through hole pattern in the cantilever state was formed of the amorphous silicon or the electron beam scattering layer without forming the pattern supporting layer. The amorphous silicon layer was designed to a thickness of 2 micron, and the leaf pattern of a square size of 10 micron was imagined, as shown in FIG. 10. In this example, it is assumed that a tensile stress necessary for the self-sustaining but no external force was exerted on the self-sustaining film. Here, it is also assumed that the pattern was made of an amorphous silicon material having a Young's modulus of 100 (GPa) according to the published values.

The deflection displacement at the leading end (as indicated by a star) of the leaf pattern, as formed at the leading end of the pattern, was estimated to about 3.8 micron. If the pattern length is multiplied by 10 in the longitudinal direction, the deflection displacement is as large as about 38 micron. In order to reduce the deflection displacement of this pattern, on the other hand, there is no way other than a method of enlarging the thickness to increase the geometric moment of inertia at the supporting portion, if neither the pattern size and the shape nor the material can be changed. In order to make the deflection displacement less than 1 micron, for example, the thickness has to be as small as about 10 micron. With this thickness, the mask pattern has to be etched at the aspect ratio of 25 (10/(0.1×4)) for a standard four-time mask body as a reticle, if the exposure of the element pattern having a specification of 0.1 micron is to be realized. The possibility for this etching is so low as to make it very difficult to manufacture the mask from the view point of precision.

On the other hand, here will be described the case in which the leaf pattern of the same size is formed by the method of the present invention. If the deflection at the film thickness construction of the aforementioned embodiment is estimated in this case, a deflection displacement of about 11 micron will occur at the pattern leading end, only with the leaf pattern portion of the electron beam scattering body. By supporting the leaf pattern portion with the SiC thin film layer of a material of a high Young's modulus, however, the maximum deflection of the leaf pattern portion can be reduced to 1 micron or less. This resulted in the solution of the local deflection at the leaf pattern portion.

Here in this embodiment, the film forming method has been exemplified by the CVD method but should not be limited thereto. Any of the film forming method such as the sputtering method, the vacuum evaporation method or the ion plating method can be employed if it satisfies the mask characteristics of the present invention.

On the other hand, the wind working method from the back side for self-sustaining the pattern region has been exemplified by the dry-etching method but should not be limited thereto. For example, the wet-etching method may be adopted according to the purpose or material. Alternatively, it is arbitrary to use the ultrasonic cutting method or to combine the ultrasonic cutting method and the dry-etching method or the wet-etching method suitably.

Moreover, the substrate material for the base should not be limited to silicon but may be any if i can satisfy the mask characteristics of the present invention as much as possible.

In this embodiment, an insulating material is contained in the mask constructing material so that the influences are worried from the charge (or the mask charging) of the mask during the drawing. Against this worry, however, the energy to be absorbed in the mask under the irradiation of acceleration electrons of 100 KeV or higher is as small as about 0.001 (W/cm$^2$), as disclosed in Japanese Patent No. 2857384. This means that most of irradiation electrons transmit so that the charging of the mask raises no serious problem. If the charge preventing effect is to be added so as to invite no error, it is possible, as disclosed in the above-specified Patent, to coat the mask with a conductor of a low atomic number such as amorphous carbon or to dope the electron beam scattering layer with boron or the like to make it conductive.

(Embodiment 2)

In a mask manufactured in Embodiment 2, the etching stopper layer 7 is sandwiched between the electron beam scattering layer 5 and the pattern supporting layer 6. This structure aims substantially at preventing the pattern supporting layer 6 from being etched by the etching stopper layer 7 at the time of etching the electron beam scattering layer 5, and is effective where the electron beam scattering layer 5 and the pattern supporting layer 6 have a small etching selection ratio. Another purpose for sandwiching the etching stopper layer 7 will be described in the following. Where a deflection is unpreferably caused in the pattern field portion due to the unbalance in the membrane stress between the electron beam scattering layer 5 and the pattern supporting layer 6, the membrane stress balance can be adjusted by adding the etching stopper layer 7. Thus, it is possible to give the etching stopper layer 7 the function to adjust the stress.

Here will be described an example of manufacturing a mask according to the present invention.

Figure 11A:
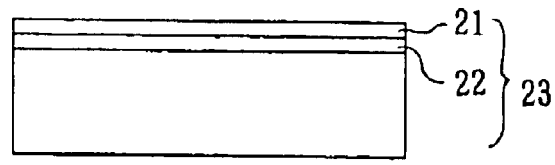
FIGS. 11A to 11F are sectional views showing a process for manufacturing a mask according to one embodiment of the present invention.
Figure 11B:
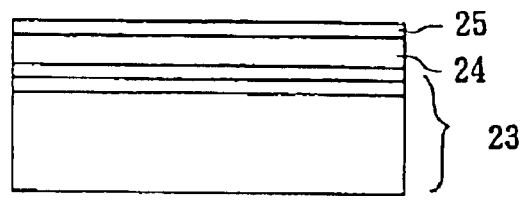

As shown in FIG. 11A, there is used as a base substrate of an SIMOX wafer 23 which is specified to have an Si layer 21 (or a pattern supporting layer) of 0.05 micron, an intermediate SiO$_2$ layer 22 of 0.05 micron and a crystal azimuth (100). Over this wafer 23, there is formed an SiO$_2$ layer (or the etching stopper layer) of 0.02 micron which is stress-controlled by the CVD method (although not shown). Subsequently, a hard carbon layer 24 (or an electron beam scattering layer) having a thickness of 0.8 micron is formed over the formed SiO$_2$ by the sputtering method (FIG. 11B). Subsequently, an SiO$_2$ layer 25 (or an etching mask layer) having a thickness of 0.05 micron is formed over the hard carbon layer 24 (FIG. 11B).

Figure 11C:
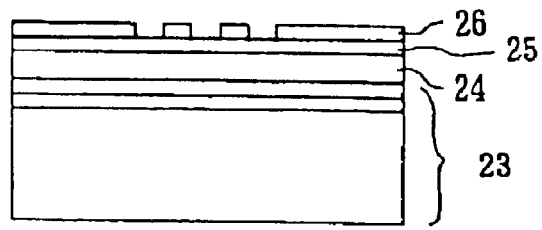
Figure 11D:
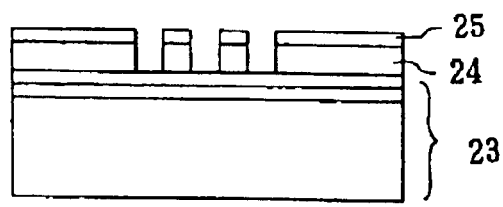

After this, a resist pattern 26 is formed by the lithography method (FIG. 11C), and the SiO$_2$ layer 25 is dry-etched by using the resist pattern 26 as the mask (FIG. 11D). After the resist pattern 26 was removed, the SiO$_2$ pattern is used to trench-etch the hard carbon layer 24 by the high-density plasma method (FIG. 11D).

Figure 11E:
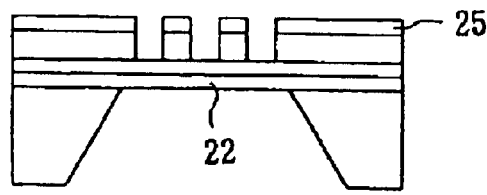
Figure 11F:
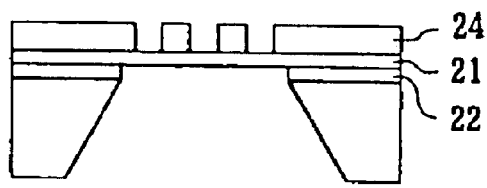

After the wind treatment (FIG. 11E) from the back side by using the wet-etching method, not only the surface SiO$_2$ layer 25 and the Intermediate SiO$_2$ layer 22 but also the etching stopper SiO$_2$ layer (although not shown) was selectively etched with a BHF liquid to manufacture the mask having the desired structure (FIG. 11F).

Here, the Si layer 21 that is the pattern supporting layer has a surface roughness (Ra) of 0.1 nm; the SiO$_2$ layer that is the etching stopper layer has a surface roughness (Ra) of 1.3 nm; and the hard carbon layer 24 that is the electron beam scattering layer has a surface roughness (Ra) of 1.1 nm.

In this case, the Si layer 21 has a tensile stress, and the hard carbon layer 24 has a compressive stress if it is formed while preferring to the dynamic characteristics. Here, a tensile stress is established by forming the SiO$_2$ layer by the atmospheric CVD method so that a pattern region having a high flatness can be easily formed by controlling the stress with the three layers.

Here in this embodiment, the SIMOX is used for the substrate whereas the CVD method is used as the film forming method, but the substrate and the film forming method should not be limited thereto. For example, the substrate may be exemplified by an adhered SOI wafer. On the other hand, the film forming method may be exemplified by any such as not only the sputtering method but also the vacuum evaporation method or the ion plating method, if it can realize the mask characteristics of the present invention. Moreover, the wind working method from the back side is exemplified by the wet-etching method but should not be limited thereto. For example, another etching method may be adopted according to the purpose. Alternatively, it is arbitrary to use the ultrasonic cutting method or to combine the ultrasonic cutting method and the dry-etching method or the wet-etching method.

Here in the mask having the film thickness construction of Embodiment 2, the exposure electron loss at 100 KeV is about 28%, which exhibited that the exposure electron loss was about one third or less, as compared with the heavy metal scattering body mask of the possible film thickness construction.

(Embodiment 3)

In Embodiment 3, here will be described the mask construction which can optimize the mask material while satisfying the mask characteristics of the present invention, and a method for manufacturing the mask.

In order to satisfy a structurally high strength and a high electron transmissivity in the mask, it is desired to reduce the film material density, to increase the material strength characteristics such as the Young's modulus, and to make the electron beam scattering body as thick as possible. In addition, the material is desired to make the pattern supporting layer as thin as possible, to have an excellent chemical resistance and an excellent irradiation resistance, and to have an excellent etchability from the view point of the pattern precision. Moreover, the material is desired not to be an insulating material while considering the charging.

Here will be enumerated the materials which satisfy those characteristics and the mask characteristics of the present invention.

The electron scattering body or the pattern supporting layer is preferred to be diamond, diamond-like carbon (DLC) or hard carbon, which is made substantially of carbon and which has an excellent material strength. These films may contain nitrogen, boron, silicon or phosphor. Where these films are formed by the general CVD method or sputtering method, however, a film having a compressive stress is formed by a thermal expansion coefficient, a lattice irregularity or the like.

Therefore, here will be described the mask structure which has been developed according to the present invention, and an example of manufacturing the mask.

Figure 12A:
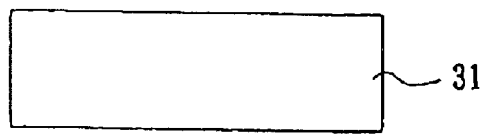
FIGS. 12A to 12F are sectional views showing a process for manufacturing a mask according to one embodiment of the present invention.
Figure 12B:
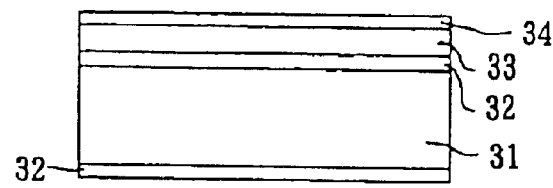

As shown in FIG. 12A, glassy carbon is adopted as the material for a substrate 31. On the surface and back sides of the substrate 31, there are formed a β-SiC film 32 having a thickness of 30 nm by the CVD method. Subsequently, there is formed over the β-SiC film 32 a nitrogen containing DLC film 33 having a thickness of 0.7 micron, over which is formed a SiO2 film 34 having a thickness of 10 nm as the etching mask (FIG. 12B). Here, a heat treatment is made in any of the vacuum, inactive or reducing atmospheres to control the stress of the nitrogen containing DLC film 33 into the tensile stress. In this case, there is worried the reduction of the $SiO_2$ film 34 or the quality change of the DLC film 33, as is caused by the contact between the DLC film 33 and the $SiO_2$ film 34. For this, there is a method of forming the $SiO_2$ film 34 after the heat treatment of the DLC film 33.

Figure 12C:
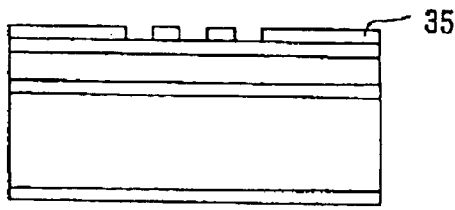
Figure 12D:
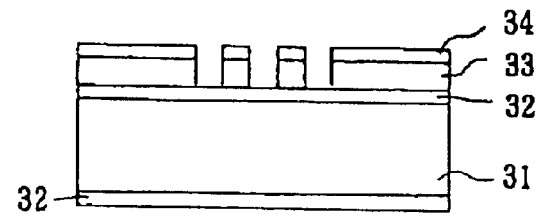

Subsequently, after a resist pattern 35 was formed (FIG. 12C), a selective dry-etching is performed from the upper layer materials to form the pattern (FIG. 12D).

Figure 12E:
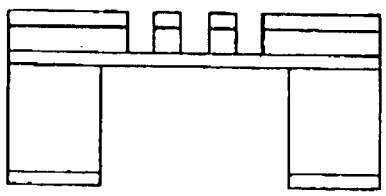

Next, the β-SiC film 32 on the back side is patterned, and the substrate 31 is subjected to the wind-treatment by the dry-etching method (FIG. 12E).

Figure 12F:
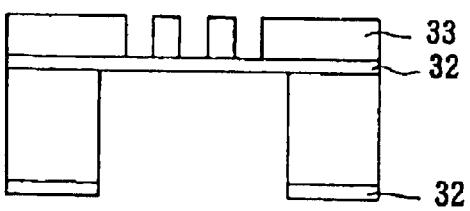

Finally, the unnecessary layers were removed to manufacture the mask (FIG. 12F).

Here in the mask having the film thickness construction of Embodiment 3, the exposure electron loss at 100 KeV is about 22%, which exhibited that the exposure electron loss was about one third or less, as compared with the heavy metal scattering body mask of the possible film thickness construction.

In this embodiment, the β-SiC film 32 on the back side is the etching mask layer for working the back side. On the other hand, the β-SiC film 32 of the 32 nm thickness on the surface side is the pattern supporting layer, and the nitrogen containing DLC film 33 is the electron beam scattering layer.

Here, the β-SiC film 32 or the pattern supporting layer has a surface thickness (Ra) of 3.8 nm, and the nitrogen containing DLC film 33 or the electron beam scattering layer has a surface roughness (Ra) of 1.5 nm.

The reason why the DLC film 33 is doped with nitrogen in the present mask structure is to reduce the DLC film resistance. By doping the DLC film 33 with nitrogen, the film resistance can be set to 1 (Ω.cm) to avoid the influences of the mask charging.

By making the base material and the electron beam scattering body substantially of a material composed of a carbon element, on the other hand, the SiC material, the $SiO_2$ and so on can be etched with an extremely high etching selectivity of 100 or more. As a result, the material selectivity can be widened, and the mask layer and the stopper layer can be extremely thinned to provide an infinitely ideal mask structure having a surplus workability.

Here in this embodiment, the film forming method has been exemplified by the CVD method but should not be limited thereto. Any of the film forming method such as not only the sputtering method but also the vacuum evaporation method or the ion plating method can be employed if it satisfies the mask characteristics of the present invention. For the mask material, on the other hand, the present invention should not be limited to the $SiO_2$ material, the SiC or the like, as exemplified in the embodiment, but any material may be employed if it satisfies the using purpose and the mask characteristics of the present invention.

On the other hand, the wind working method from the back side for self-sustaining the pattern region (or the mask field) has been exemplified by the dry-etching method but should not be limited thereto. For example, it is arbitrary to use the ultrasonic cutting method or to combine the ultrasonic cutting method and the dry-etching method suitably. Alternatively, it is arbitrary to use the wet-etching method or to combine the wet-etching method and the dry-etching method.

(Embodiment 4)

This embodiment is characterized by eliminating the film forming step. Here will be described the materials and the manufacture example.

Figure 13A:
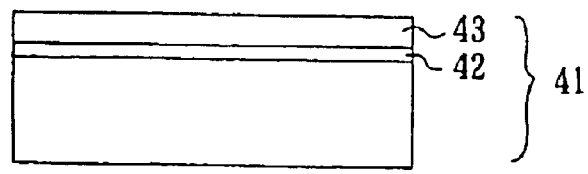
FIGS. 13A to 13E are sectional views showing a process for manufacturing a mask according to one embodiment of the present invention.

As shown in FIG. 13A, a Si wafer is used for a substrate 41. This substrate 41 is impregnated from its surface with carbon by an ion implantation method similar to that of forming the SIMOX substrate and is subjected to a heat treatment under vacuum to form a SiC layer 42 having a thickness of 50 nm as a pattern supporting layer at a desired depth in the Si wafer. By this method, the mask blank is formed without using the film forming method.

Figure 13B:
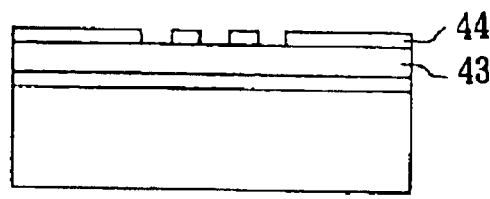
Figure 13C:
Figure 13D:
Figure 13E:
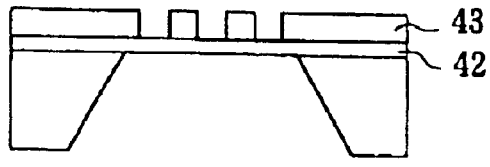

Next, there is formed over a surface Si layer 43 a resist pattern 44 (FIG. 13B). This resist pattern 44 is used as the mask to dry-etch the surface Si layer 43 of a thickness of 0.35 micron to form the electron beam scattering body pattern (FIG. 13C). Subsequently, the back side is windworked by the wet etching method (FIG. 13D) to remove the resist pattern 44 thereby to manufacture a mask having the target structure (FIG. 13E). Here, the SiC layer 42 or the pattern supporting layer has a surface roughness (Ra) of 0.3 nm, and the Si layer 43 or the electron beam scattering layer has a surface roughness (Ra) of 0.3 nm.

Here in the mask having the film thickness construction of Embodiment 4, the exposure electron loss at 100 KeV is about 37%, which exhibited that the exposure electron loss was about one third or less, as compared with the heavy metal scattering body mask of the possible film thickness construction.

(Embodiment 5)

This embodiment considers the film stress control of the pattern region (or the thin film portion) including the electron beam scattering body. Here will be described the materials and the manufacture method.

In the Embodiment 3, in the film forming case in which the stress is adjusted for each layer, it is assumed that the film stress balance in the state before the formation of the trench (deep-dug) pattern is adjusted to control the self-sustainability of the film. In the case of the trench pattern formation of different pattern densities in the pattern region, moreover, the scattering layer stress is liable to change with the difference in the pattern density to change the warpage in the pattern region portion around the trench pattern formation.

For this countermeasure, it is possible to form a film having the film stress characteristics considering the pattern density at the time of forming the initial film. In this case, however, the controllability may be difficult in contrast with the film quality. For this countermeasure, where the pattern region (or the thin film portion) warps in the bulging direction, the pattern region is coated from its back side with such a material, e.g., the DLC thin film as will establish a stress in the compressing direction, within a film thickness range to exert the least influence on the electron energy loss. It follows that the warpage of the pattern region can be easily adjusted.

Where the warpage occurs in the recessing direction, on the contrary, a tensile stress film may be formed when the adjustment is made from the back side, and vice versa when the adjustment is made from the surface side.

According to this method, it is easily possible to make countermeasures for the change in the warpage of the thin film layer around the pattern formation. This also means that it is also possible to reduce the stress change which is caused for another reason not only around the pattern formation but also after the mask formation.

Here will be described a more specific example in the following.

Figure 14A:
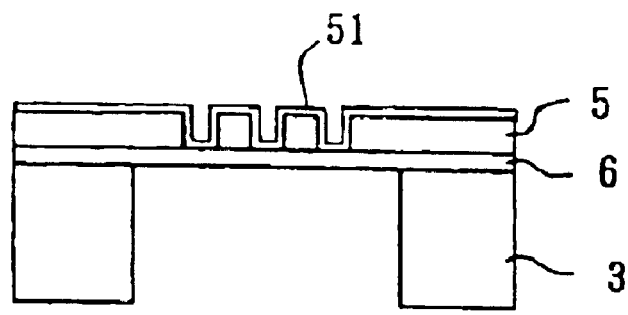
FIGS. 14A and 14B are sectional views showing a portion of a process for manufacturing a mask according to one embodiment of the present invention.

As shown in FIG. 14A, there is used a mask which is constructed to Include: the support members 3 made of glassy carbon; the pattern supporting film 6 made of SiC (having a film thickness of 40 nm); and the electron beam scattering body pattern 5 made of the DLC (having a film thickness of 550 nm). On the surface side of the mask, there is formed a stress adjusting film 51 (or a tensile stress film) which is made of amorphous germanium (Ge) (having a film thickness of 10 nm). As a result, it was possible to adjust the stress of the pattern region easily.

Figure 14B:
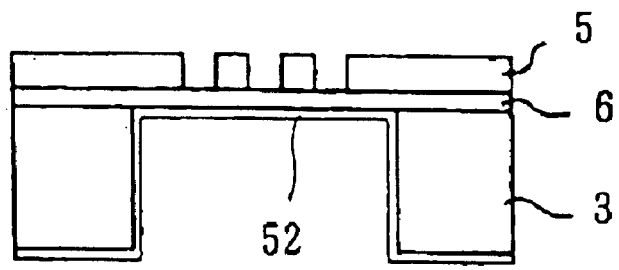

As shown in FIG. 14B, on the other hand, there is used a mask which is constructed to Include: the support members 3 made of Si; the pattern supporting film 6 made of TiSiO$_2$ (having a film thickness of 55 nm); and the electron beam scattering body pattern 5 made of a B-doped DLC (having a film thickness of 450 nm). On the back side of the mask, there is formed a stress adjusting film 52 (or a compressive stress film) which is made of the TiC (having a film thickness of 12 nm). As a result, it was possible to adjust the stress of the pattern region easily.

(Embodiment 6)

This embodiment is a manufacture method considering the workability of the back side and the allowability of the thickness of the pattern supporting layer within a predetermined range, and considers the improvement in the production yield and the shortening of the manufacture period. Here will be described the materials and the example of the manufacture method.

Figure 15A:
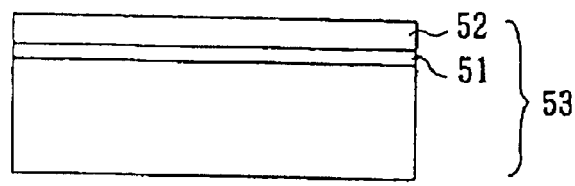
FIGS. 15A to 15G are sectional views showing a process for manufacturing a mask according to one embodiment of the present invention.

As shown in FIG. 15A, there is used as the substrate an SOI wafer 53 which is prepared by adhering the Si layer 52 (or the electron beam scattering layer) having a thickness of 0.6 micron and the intermediate SiO$_2$ layer 51 having a thickness of 0.05 micron.

Figure 15B:
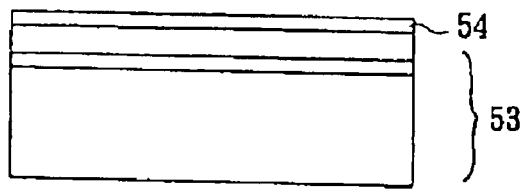
Figure 15C:
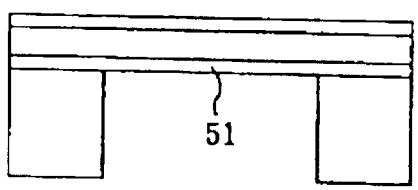

Over the SOI wafer 53, there is formed as an etching mask layer a weak tensile stress SiO$_2$ layer 54 having a thickness of 0.1 micron (FIG. 15B). Then, this layer 54 is subjected to the wind treatment from its back side (FIG. 15C).

Figure 15D:
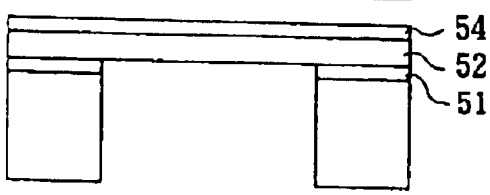
Figure 15E:
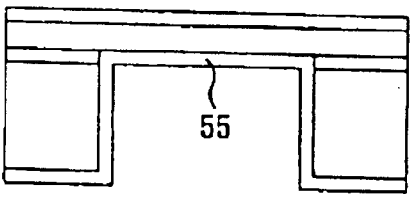

Next, the intermediate SiO$_2$ layer 51 that is the etching stopper layer at the wind treatment is selectively removed (FIG. 15D). After this, an SiC layer 55 that is a pattern supporting member is formed to have a thickness of 50 nm from the back side all over the pattern region by the CVD method (FIG. 15D).

Next, this mask blank is used to form a transfer pattern.

Figure 15F:
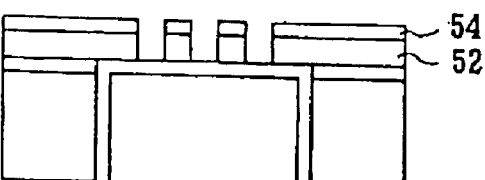

First of all, a resist pattern (not-shown) is formed and is then transferred as the mask to the Si02 layer 54 by the etching method (FIG. 15F). Subsequently, the SiO$_2$ layer 54 is used to trench-etch the Si single crystal layer 52 that is the electron beam scattering layer (FIG. 15F).

Figure 15G:
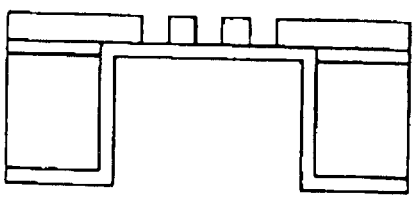

Moreover, the SiO$_2$ layer 54 that is the unnecessary dry-etching mask layer was removed to manufacture the target mask (FIG. 15G).

Here, the SiC layer 55 that is the pattern supporting layer has a surface roughness (Ra) of 3.7 nm, and the Si single crystal layer 52 that is the electron beam scattering layer has a surface roughness (Ra) of 0.1 nm. In this embodiment, no restriction is made on the film forming order, and the step order may be arbitrarily changed. On the other hand, the thickness of the pattern supporting layer can be easily set within a range satisfying the mask characteristics of the present invention while considering the transfer pattern density or the like, so that the degree of freedom is enhanced. Here in the mask having the film thickness construction of Embodiment 6, the exposure electron loss at 100 KeV is about 34%, which exhibited that the exposure electron loss was about one third or less, as compared with the heavy metal scattering body mask of the possible film thickness construction.

The values of the densities of the materials employed in the foregoing embodiment, the electron mean free paths at 100 KeV, and the elastic moduli are enumerated in Table 1:

TABLE 1

|  | Density (g/cm$^3$) | Electron Mean Free Path at 100 keV | Elastic Moduli in Embodiment |
| --- | --- | --- | --- |
| amorphous Si | 2.1 | 0.22 μm | 1.0 × 10$^{11}$Pa |
| SiC | 3.1 | 0.15 μm | 4.5 × 10$^{11}$Pa |
| Si | 2.3 | 0.20 μm | 1.6 × 10$^{11}$Pa |
| DLC (or hard carbon) | 1.9–3.5 | 0.24–0.13 μm | 0.8–11.0 × 10$^{11}$Pa |
| SiO2 | 2.2 | 0.21 μm | 0.8 × 10$^{11}$Pa |

(Embodiment 7)

In the mask, as manufactured in Embodiment 7, the electron beam scattering layer and the pattern supporting layer are made of the DLC, and the etching stopper layer is sandwiched between the electron beam scattering layer and the pattern supporting layer.

The DLC is enabled by selecting and controlling the film forming method and the film forming condition to form a film of an amorphous structure having a small surface roughness (e.g., a surface roughness (Ra) of 2 nm or less). According to this structure, it is possible to reduce the surface roughnesses of the pattern supporting layer and the electron beam scattering layer. It follows that the influences of the surface roughness, as has been described in the foregoing eleventh aspect, can be further reduced. On the other hand, the DLC can control the density and the Young's modulus according to the film forming condition so that the electron beam scattering body and the pattern supporting layer can be set to the desired thicknesses. In addition, the DLC is excellent in the chemical resistance and the irradiation resistance and is enabled to form a highly precise pattern by the dry-etching.

Here will be described an example of manufacturing the mask.

Over the silicon substrate, as shown in FIG. 16A, a DLC layer 61 (or a pattern supporting layer) is formed to have a thickness of 30 nm by the ECR-sputtering method. Subsequently, there is formed over the DLC layer 61 a stress-controlled amorphous Si layer 62 (or the etching stopper layer) having a thickness of 20 nm by the CVD method. Subsequently, there is formed over the amorphous Si layer 62 a DLC layer 63 (or the electron beam scattering layer) having a thickness of 400 to 700 nm by the ECR-sputtering method. Over the DLC layer 63, moreover, there is formed an $SiO_2$ layer 64 (or the etching mask layer) having a thickness of 30 nm.

After this, a resist pattern 6 is formed (FIG. 16B) by the lithography method and is used as the mask to dry-etch the $SiO_2$ layer 64. Subsequently, after the removal of the resist pattern 65, the $SiO_2$ pattern 64 is used as the mask to trench-etch the DLC layer 63 by the high-density plasma method (FIG. 16C).

The back side is subjected to the wind-treatment (FIG. 16D) by using the wet-etching method, and the surface $SiO_2$ layer 64 is removed by the BHF liquid to manufacture the mask having a desired structure (FIG. 16E).

Here: the DLC layer 61 that is the pattern supporting layer has a surface roughness (Ra) of 16 nm; the amorphous Si layer 62 that is the etching stopper layer has a surface roughness (Ra) of 1.1 nm; and the DLC layer 63 that is the electron beam scattering layer has a surface roughness (Ra) of 1.8 nm.

In the aforementioned mask, the DLC layer 61 is given a slightly tensile stress, and the DLC layer 63 is given a slightly tensile stress. Here, the amorphous Si layer 62 by the CVD method is given the slightly compressive stress by forming it by the ECR-CVD method, and a pattern region having a high flatness can be formed by controlling the stress with the three layers.

Here in this embodiment, the DLC film forming method is exemplified by the ECR-sputtering method, but the film forming method should not be limited thereto. For example, the film forming method can also be employed by the ion-beam sputtering method (including the positive ion-beam sputtering method and the negative ion-beam sputtering method), the opposed target sputtering method (or the FTS sputtering method). On the other hand, the DLC film forming method can be exemplified by the CVD method such as the ECR-CVD method, the RE-CVD method or the optical CVD method.

Here in the mask having the film thickness construction of Embodiment 7, the exposure electron loss at 100 KeV is about 27%, which exhibited that the exposure electron loss was about one third or less, as compared with the heavy metal scattering body mask of the possible film thickness construction.

(Embodiment 8)

In the mask to be manufactured in Embodiment 8, the electron beam scattering layer is made of the DLC which is doped with at least one of B, N, Si and P. On the other hand, the pattern supporting layer is made of the DLC which is doped with at least one of B, N, P, Ti, Si and Al, and the etching stopper layer is sandwiched between the electron beam scattering layer and the pattern supporting layer.

This structure is preferable because the electron beam scattering layer and the pattern supporting layer can be individually given conductivities, in addition to the effects of the mask construction of Embodiment 7.

Here will be described an example of the mask manufacture. Incidentally, the process of Embodiment 8 is identical to that of Embodiment 7 so that the description will be made with reference to FIGS. 16A to 16E.

As shown in FIG. 16A, there is formed over the silicon substrate the DLC layer 61 (or the pattern supporting layer) which is doped with 8% of Si to have a thickness of 20 nm, by the opposed target sputtering method. Over the DLC layer 61, there is formed the stress-controlled amorphous Si layer 62 (or the etching stopper layer) having a thickness of 10 nm by the magnetron sputtering method. Over the amorphous Si layer 62, there is formed the DLC layer 63 (or the electron beam scattering layer) which is doped with 11% of N to have a thickness of 400 to 700 nm, by the opposed target sputtering method. Over the DLC layer 63, moreover, there is formed the $SiO_2$ layer 64 (or the etching mask layer) which has a thickness of 0.05 micron.

After this, the resist pattern 65 is formed (FIG. 16B) by the lithography method and is used as the mask to dry-etch the $SiO_2$ layer 64. Subsequently, after the removal of the resist pattern 65, the $SiO_2$ pattern 64 is used as the mask to trench-etch the DLC layer 63 by the high-density plasma method (FIG. 16C).

The back side is subjected to the wind-treatment (FIG. 16D) by using the wet-etching method, and the surface $SiO_2$ layer 64 is removed by the BHF liquid to manufacture the mask having a desired structure (FIG. 16E).

Here: the Si-doped DLC layer 61 that is the pattern supporting layer has a surface roughness (Ra) of 0.9 nm; the amorphous Si layer 62 that is the etching stopper layer has a surface roughness (Ra) of 1.1 nm; and the N-doped DLC layer 63 that is the electron beam scattering layer has a surface roughness (Ra) of 1.6 nm.

In the aforementioned mask, the Si-doped DLC layer 61 is given a slightly tensile stress, and the N-doped DLC layer 63 is given a substantially zero stress. Here, the amorphous Si layer 62 is given the substantially zero stress by forming it by the magnetron sputtering method, so that a pattern region having a high flatness can be easily formed by controlling the stress with the three layers.

Here in the mask having the film thickness construction of Embodiment 8, the exposure electron loss at 100 KeV is about 21%, which exhibited that the exposure electron loss was about one third or less, as compared with the heavy metal scattering body mask of the possible film thickness construction.

Here in this embodiment, the DLC film forming method is exemplified by the opposed target sputtering method, but the film forming method should not be limited thereto. For example, the film forming method can also be employed by the ion-beam sputtering method (including the positive ion-beam sputtering method and the negative Ion-beam sputtering method), the ECR-sputtering method (or the FTS sputtering method). On the other hand, the DLC film forming method can be exemplified by the CVD method such as the ECR-CVD method, the RE-CVD method or the optical CVD method.

(Embodiment 9)

The electron beam drawing masks, as manufactured according to the Embodiments 1 to 8, were used to execute exposure tests individually with the acceleration voltages of the exposure electron beam at 150 KeV, 100 KeV, 50 KeV and 30 KeV. The results were that the exposure electron losses were small and that the strengths of the leaf pattern and the ring pattern portion were sufficient. Under any of the acceleration voltages, moreover, the transmission and scattering of the electrons were controlled to exhibit a beam contrast of 90% or higher. Under any acceleration voltage, moreover, the scattering of the electrons could be controlled to reduce the influence of the color aberration and to shorten the exposure time period so that the pattern could be transferred highly precisely to the exposure substrate. Here, these masks can be used at 50 KeV or higher so that they can be used at a high acceleration voltage of the SCALPEL system or the like.

Although the present invention has been described by enumerating its several embodiments, it should not be limited to the scopes of the invention. In the Embodiments 1 to 8, for example, the step order should not be especially limited if it can satisfy the mask structure of the final target. On the other hand, the etching mask may be made of any material including an organic material such as a resist, an inorganic material such as $SiO_2$ or a metallic material.

Moreover, the electron beam scattering body material or the pattern supporting layer material may be any if it satisfies the mask characteristics of the present invention. This material can be exemplified by not only the aforementioned ones but also a chemical semiconductor material such as boron nitride (BNx), carbon nitride (CNx), titanium nitride (TiNx), indium phosphide (InP) or gallium nitride (GaNx). In addition, there can be used any material including a silicide such as titanium silicide (TiSix), a carbide such as titanium carbide (TiC) or a boride such as B-doped Si (111) or TiBx, if it satisfies the required characteristics such as the chemical resistance, the etching workability or the film forming property. The etching stopper layer can be exemplified by not only the aforementioned ones but also Si, Ti, TiCNx or TiSix.

On the mask blank (or the substrate for manufacturing the mask), moreover, the intermediate products, as exemplified in the foregoing embodiments, such as the substrates having been filmed in Embodiment 1 or having been subjected to the wind treatment after filmed are all included in the mask blank.

On the other hand, the intermediate products, as exemplified by the substrate before the pattern is formed, such as the etching mask layer for the etching treatment or the substrate having the etching stopper layer are all included in the mask blank. In these mask blank, an alignment mark has to be formed on the surface and back sides in the course of the mask manufacture because the mask blank has to be etched from its surface and back sides. The method of forming the alignment mark can be exemplified by a step pattern by the etching method or by a mark formation by the film forming method. On the other hand, any mark shape is accepted if its material can allow the alignment of the two sides.

As has been described, the mask of the present invention satisfies not only the mask structure characteristics and the manufacture characteristics but also the required characteristics in the lithography, as will be described in the following.

According to the mask structure of the present invention relating to the beam contrast on the exposure substrate, any of the various mask structures and mask making materials, as exemplified in the embodiments, can provide a beam contrast of 85% or higher.

By making the pattern supporting layer thinner, as has been difficult in the mask examples (e.g., the SCALPEL mask) disclosed in the prior art, on the other hand, the energy loss at the drawing time can be reduced to one half to one quarter of that of the membrane mask which has been proposed in the prior art. It follows that the influence of the color aberration can be lowered to reduce the current value limit, as restricted by the electron Coulomb effect. As a result, where the substantial exposure time period is compared with that of the exposure using the complementary mask of the stencil type, the exposure aspect using the mask of the present invention can make a high-speed exposure as high as about 1.1 to 1.6 times.

According to the mask of the present invention, the transmission and scattering of electrons can be controlled to provide an excellent beam contrast while controlling the scattering of electrons, to reduce the loss of the exposure electrons, to lower the influence of the color aberration and to shorten the exposure time period.

On the structural characteristics, the mask of the present invention allows the film to sustain by itself and can form the flat leaf pattern or ring pattern without deflection, to adjust the film stress thereby to provide an excellent strength or stability as the mask.

The mask blank of the present invention can perform the trench (or deep dug) etching (at a high aspect ratio) to have a sufficiently high etching selection ratio, a high working precision and excellent manufacture characteristics.

According to the present invention, on the other hand, the excellent mask structure and mask manufacturing method can be established to improve the lithography characteristics thereby to manufacture a superhigh integrated circuit.

What is claimed is:

1. An electron beam drawing mask blank comprising: a pattern supporting layer for transmitting an electron beam therethrough; an electron beam scatter layer formed over said pattern supporting layer; and a support member for supporting said pattern supporting layer and said electron beam scattering layer, wherein said electron beam scattering layer is made of a material composed substantially of the carbon element and/or the silicon element.

2. An electron beam drawing mask blank as claimed in claim 1, wherein said electron beam scattering layer is made of a material composed substantially of the carbon element.

3. An electron beam drawing mask by as claimed in claim 2, wherein said electron beam scattering layer is made of either a diamond like carbon or a material containing a diamond like carbon doped with at least one of B, N, Si and P.

4. An electron beam drawing mask blank as claimed in claim 3, wherein the doping of said diamond like carbon with at least one of B, N, Si and P is 0.1 to 40 mole %.

5. An electron beam drawing mask blank as claimed in claim 1, wherein said electron beam scattering layer is made of a material composed substantially of the silicon element.

6. An electron bean drawing mask blank as claimed in any of the claims 1 to 5, wherein said pattern supporting layer is made of a material composed substantially of the carbon element.

7. An electron beam drawing mask blank as claimed in claim 6, wherein said pattern supporting layer is made of either a diamond like carbon or a material containing a diamond like carbon doped with at least one of B, N, P, Ti, Si and Al.

8. An electron beam drawing mask blank as claimed in claim 7, wherein the doping of said diamond like carbon with at least one of B, N, P, Ti, Si and Al is 0.1 to 40 mole %.

9. An electron beam drawing mask blank as claimed in any of the claims 1 to 5, wherein said pattern supporting layer is made of a material composed substantially of the silicon element.

10. An electron beam drawing mask blank as claimed in claim 1, further comprising an etching stopper layer sandwiched either between said electron beam scattering layer and said pattern supporting layer or between said pattern supporting layer and said support member.

11. An electron beam drawing mask blank as claimed in claim 10, wherein said etching stopper layer is made of a material having a high etching selection ratio with said electron beam scattering layer and/or said support member.

12. An electron beam drawing mask blank as claimed in claim 1, wherein said support member is made of a material composed substantially of the carbon element.

13. An electron beam drawing mask blank comprising: a pattern supporting layer for transmitting an electron beam therethrough; an etching stopper layer formed over said pattern supporting layer; an electron beam scattering layer formed over said etching stopper layer; and a support member for supporting said pattern supporting layer, said etching stopper layer and said electron beam scattering layer, wherein said electron beam scattering layer is made of either a diamond like carbon or a material containing a diamond like carbon doped with at least one of B, N, Si and P; said pattern supporting layer is made of either a diamond like carbon or a material containing a diamond like carbon doped with at last one of B, N, P, Ti, Si and Al; and said etching stopper layer is made of a material having a high etching selection ratio with said electron beam scattering layer.

14. An electron beam drawing mask blank comprising: a pattern supporting layer for transmitting an electron beam therethrough; an electron beam scattering layer formed over said pattern supporting layer; and a support member for supporting said pattern supporting layer and said electron beam scattering layer, wherein said pattern supporting layer has a film thickness of 0.005 to 0.2 micron whereas said electron beam scattering layer has a film thickness of 0.2 to 2 micron so that they are made of materials satisfying these film thickness relations.

15. An electron beam drawing mask blank as claimed in claim 14, wherein said pattern supporting layer satisfies the following Formula (1)

$$Tt \leq 2\alpha \quad (1),$$

wherein Tt indicates the film thickness of the pattern supporting layer; and a indicates a mean free path of electrons in the pattern supporting layer.

16. An electron beam drawing mask blank as claimed in claim 14, wherein said electron beam scattering layer satisfies the following Formula (2)

$$2\beta \leq Ts \leq 10\beta \quad (2),$$

wherein Ts indicates the film thickness of the electron beam scattering layer; and $\beta$ indicates a mean free path of electrons in the electron beam scattering layer.

17. An electron beam drawing mask blank as claimed in any of the claim 14 or 15, wherein said pattern supporting layer and said electron beam scattering layer have film material densities of 1.0 to 5.0 $g/cm^3$.

18. An electron beam drawing mask blank as claimed in any of the claims 14 to 16, wherein said pattern supporting layer and/or said electron beam scattering layer have elastic moduli of $0.8 \times 10^{11}$ Pa or higher.

19. An electron beam drawing mask blank as claimed in any of the claims 14 to 16, wherein said pattern supporting layer and/or said electron beam scattering layer have a film thickness dispersion of 30% or less within one shot area.

20. An electron beam drawing mask blank as claimed in any of the claims 14 to 16, wherein said electron beam scattering layer is made of a material composed substantially of the carbon element and/or the silicon element.

21. An electron beam drawing mask blank as claimed in any of the claims 14 to 16, further comprising an etching stopper layer sandwiched either between said electron beam scattering layer and said pattern supporting layer or between said pattern supporting layer and said support member.

22. An electron beam drawing mask blank as claimed in claim 21, wherein said etching stopper layer has a film thickness of 0.005 to 0.2 micron.

23. An electron beam drawing mask blank as claimed in claim 21, wherein said etching stopper layer has a film material density of 1.0 to 5.0 $g/cm^3$.

24. An electron beam drawing mask blank as claimed in claim 21, wherein said etching stopper layer is made of a material having a high etching selection ratio with said electron beam scattering layer and/or said support member.

25. An electron beam drawing mask blank as claimed in any of the claims 14 to 16, wherein at least one layer of said pattern supporting layer, said etching stopper layer and said electron beam scattering layer has a surface roughness (Ra) of 1.0 nm or lower.

26. An electron beam drawing mask blank as claimed in any of the claims 14 to 16, wherein either at least one layer of said pattern supporting layer, said etching stopper layer and said electron beam scattering layer is stress-controlled by a heat treatment or at least two layers are simultaneously subjected to a heat treatment to control the film stress thereby to reduce the total film stress.

27. An electron beam drawing mask, manufactured by using the mask blank as claimed any of the claims 1 to 5 and 13 to 16.

28. An electron beam drawing mask comprising: a pattern supporting film for transmitting an electron beam therethrough; an electron beam scattering body pattern formed over said pattern supporting film; and a support member for supporting said pattern supporting film and said electron beam scattering body pattern, wherein said pattern supporting film has a film thickness of 0.005 to 0.2 micron, a film material density of 1.0 to 5.0 $g/cm^3$ and an elastic modulus of $0.9 \times 10^{11}$ Pa or higher; and said electron beam scattering body pattern has a film thickness of 0.2 to 2 micron, a film material density of 1.0 to 5.0 $g/cm^3$, and an elastic modulus of $0.8 \times 10^{11}$ Pa or higher.

29. An electron beam drawing mask comprising: a pattern supporting film for transmitting an electron beam therethrough; an electron beam scattering body pattern formed over said pattern supporting film; and a support member for supporting said pattern supporting film and said electron beam scattering body pattern, wherein at least one of said support member, said pattern supporting film and said election beam scattering body pattern is made of a material composed substantially of carbon element.

30. An electron beam drawing mask comprising: a pattern supporting film for transmitting an electron beam therethrough; an electron beam scattering body pattern formed over said pattern supporting film; an etching stopper layer formed all over said pattern supporting film or left under said electron beam scattering body pattern; and a support member for supporting said pattern supporting film, said etching stopper layer and said electron beam scattering body pattern, wherein said electron beam scattering body pattern is made of either a diamond like carbon or a material containing a diamond like carbon doped with at least one of B, N, Si and P; said pattern supporting film is made of either a diamond like carbon or a material containing a diamond like carbon doped with at least one of B, N, P, Ti, Si and Al; and said etching stopper layer is made of a material having a high etching selection ratio with said electron beam scattering layer.

31. An electron beam drawing mask comprising: a pattern supporting film for transmitting an electron beam therethrough; an electron beam scattering body pattern formed over said pattern supporting film; and a support member for supporting said pattern supporting film and said electron beam body pattern, wherein: said electron beam scattering body pattern is made of a material composed substantially of the silicon element; and said pattern supporting film is made of SiC or TiC.

32. An electron beam drawing mask comprising: a pattern supporting film for transmitting an electron beam therethrough; an etching stopper layer formed over said pattern supporting film; an electron beam scattering body pattern formed over said etching stopper layer; and a support member for supporting said pattern supporting film, said etching stopper layer and said electron beam scattering body pattern, wherein said electron beam scattering body pattern is made of hard carbon; said etching stopper layer is made of SO2; and said pattern supporting film is made of a material composed substantially of the silicon element.

33. An electron beam drawing mask comprising: a pattern supporting film for transmitting an electron beam therethrough; an electron beam scattering body pattern formed over said pattern supporting film; and a support member for supporting said pattern supporting film and said electron beam scattering body pattern, wherein said electron beam scattering body pattern is made of either a diamond like carbon or a material containing a diamond like carbon doped with at least one of B, N, Si and P; said pattern supporting film is made of R—SiC.

34. An electron beam drawing mask comprising: a pattern supporting film for transmitting an electron beam therethrough; an electron beam scattering body pattern formed over said pattern supporting; and a support member for supporting said pattern supporting film and said electron beam scattering body pattern, wherein said electron beam scattering body pattern is made of a material composed substantially of the silicon element; and said pattern supporting film is made of SiC.

35. An electron beam drawing mask comprising: a pattern supporting film for transmitting an electron beam therethrough; an electron beam scattering body pattern formed over said pattern supporting film; and a support member for supporting said pattern supporting film and said electron beam scattering body pattern, wherein said electron beam scattering body pattern is made of a material composed substantially of the silicon element; and said pattern supporting film is made of either a diamond like carbon or a material containing a diamond like carbon doped with at least one of B, N, P, Ti, Si and Al.

36. An electron beam drawing mask as claimed in any of the claims 28 to 35, wherein said electron beam drawing mask is adapted for use at an acceleration voltage of an exposure electron beam of 30 KeV or higher.

37. An electron beam drawing mask blank as claimed in claim 2, further comprising an etching stopper layer sandwiched either between said electron beam scattering layer and said supporting layer or between said pattern supporting layer and said support member.

38. An electron beam drawing mask blank as claimed in claim 3, further comprising an etching stopper layer sandwiched either between said electron beam scattering layer and said pattern supporting layer or between said pattern supporting layer and said support member.

39. An electron beam drawing mask blank as claimed in claim 4, further comprising an etching stopper layer sandwiched either between said electron beam scattering layer and said pattern supporting layer or between said pattern supporting layer and said support member.

40. An electron beam drawing mask blank as claimed in claim 5, further comprising an etching stopper layer sandwiched either between said electron beam scattering layer and said pattern supporting layer or between said pattern supporting layer and said support member.

41. An electron beam drawing mask blank as claimed in claim 6, further comprising an etching stopper layer sandwiched either between said electron beam scattering layer and said pattern supporting layer or between said pattern supporting layer and said support member.

42. An electron beam drawing mask blank as claimed in claim 7, further comprising an etching stopper layer sandwiched either between said electron beam scattering layer and said pattern supporting layer or between said pattern supporting layer and said support member.

43. An electron beam drawing mask blank as claimed in claim 8, further comprising an etching stopper layer sandwiched either between said electron beam scattering layer and said pattern supporting layer or between said pattern supporting layer and said support member.

44. An electron beam drawing mask blank as claimed in claim 9 further comprising an etching stopper layer sandwiched either between said electron beam scattering layer and said pattern supporting layer or between said pattern supporting layer and said support member.

45. An electron beam drawing mask blank as claimed in claim 37, wherein said etching stopper layer is made of a material having a high etching selection ratio with said electron beam scattering layer and/or said supporting member.

46. An electron beam drawing mask blank as claimed in claim 38, wherein said etching stopper layer is made of a material having a high etching selection ratio with said electron beam scattering layer and/or said support member.

47. An electron beam drawing mask blank as claimed in claim 39, wherein said etching stopper layer is made of a material having a high etching selection ratio with said electron beam scattering layer and/or said support member.

48. An electron beam drawing mask blank as claimed in claim 40, wherein said etching stopper layer is made of a material having a high etching selection ratio with said electron beam scattering layer and/or said support member.

49. An electron beam drawing mask blank as claimed in claim 41, wherein said etching stopper layer is made of a material having a high etching selection ratio with said electron beam scattering layer and/or said support member.

50. An electron beam drawing mask blank as claimed in claim 42, wherein said etching stopper layer is made of a material having a high etching selection ratio with said electron beam scattering layer and/or said support member.

51. An electron beam drawing mask blank as claimed in claim 43, wherein said etching stopper layer is made of a material having a high etching selection ratio with said electron beam scattering layer and/or said support member.

52. An electron beam drawing mask blank as claimed in claim 44, wherein said etching stopper layer is made of a material having a high etching selection ratio with said electron beam scattering layer and/or said support member.

53. An electron beam drawing mask blank as claimed in claim 2, wherein said support member is made of a material composed substantially of the carbon element.

54. An electron beam drawing mask blank as claimed in claim 3 wherein said support member is made of a material composed substantially of the carbon element.

55. An electron beam drawing mask blank as claimed in claim 4 wherein said support member is made of a material composed substantially of the carbon element.

56. An electron beam drawing mask blank as claimed in claim 5, wherein said support member is made of a material composed substantially of the carbon element.

57. An electron beam drawing mask blank as claimed in claim 6, wherein said support member is made of a material composed substantially of the carbon element.

58. An electron beam drawing mask blank as claimed in claim 7, wherein said support member is made of a material composed substantially of the carbon element.

59. An electron beam drawing mask blank as claimed in claim 8, wherein said support member is made of a material composed substantially of the carbon element.

60. An electron beam drawing mask blank as claimed in claim 9, wherein said support member is made of a material composed substantially of the carbon element.

61. An electron beam drawing mask blank as claimed in claim 10, wherein said support member is made of a material composed substantially of the carbon element.

62. An electron beam drawing mask blank as claimed in claim 37, wherein said support member is made of a material composed substantially of the carbon element.

63. An electron beam drawing mask blank as claimed in claim 38, wherein said support member is made of a material composed substantially of the carbon element.

64. An electron beam drawing mask blank as claimed in claim 39, wherein said support member is made of a material composed substantially of the carbon element.

65. An electron beam drawing mask blank as claimed in claim 40, wherein said support member is made of a material composed substantially of the carbon element.

66. An electron beam drawing mask blank as claimed in claim 41, wherein said support member is made of a material composed substantially of the carbon element.

67. An electron beam drawing mask blank as claimed in claim 42, wherein said support member is made of a material composed substantially of the carbon element.

68. An electron beam drawing mask blank as claimed in claim 43, wherein said support member is made of a material composed substantially of the carbon element.

69. An electron beam drawing mask blank as claimed in claim 45, wherein said support member is made of a material composed substantially of the carbon element.

70. An electron beam drawing mask blank as claimed in claim 46, wherein said support member is made of a material composed substantially of the carbon element.

71. An electron beam drawing mask blank as claimed in claim 47, wherein said support member is made of a material composed substantially of the carbon element.

72. An electron beam drawing mask blank as claimed in claim 48, wherein said support member is made of a material composed substantially of the carbon element.

73. An electron beam drawing mask blank as claimed in claim 49 wherein said support member is made of a material composed substantially of the carbon element.

74. An electron beam drawing mask blank as claimed in claim 50, wherein said support member is made of a material composed substantially of the carbon element.

75. An electron beam drawing mask blank as claimed in claim 51, wherein said support member is made of a material composed substantially of the carbon element.

76. An electron beam drawing mask blank as claimed in claim 52, wherein said support member is made of a material composed substantially of the carbon element.

77. An electron beam drawing mask blank as claimed in claim 17, wherein said pattern supporting layer and/or said electron beam scattering layer have elastic moduli of $0.8 \times 10^{11}$ Pa or higher.

78. An electron beam drawing mask blank as claimed in claim 17, wherein said pattern supporting layer and/or said electron beam scattering layer have a film thickness dispersion of 30% or less within one shot area.

79. An electron beam drawing mask blank as claimed in claim 17, wherein said electron beam scattering layer is made of a material composed substantially of the carbon element and/or the silicon element.

80. An electron beam drawing mask blank as claimed in claim 18, wherein said electron beam scattering layer is made of a material composed substantially of the carbon element and/or the silicon element.

81. An electron beam drawing mask blank as claimed in claim 19, wherein said electron beam scattering layer is made of a material composed substantially of the carbon element and/or the silicon element.

* * * * *